und Patent [19]

United States Patent [19]
Kodama

[11] Patent Number: 5,049,759
[45] Date of Patent: Sep. 17, 1991

[54] SIGNAL PROCESSING SYSTEM FOR PERIOD-TO-VOLTAGE CONVERSION

[75] Inventor: Masami Kodama, Kanagawa, Japan

[73] Assignee: Atsugi Motor Parts Company Limited, Kanagawa, Japan

[21] Appl. No.: 341,358

[22] Filed: Apr. 21, 1989

[30] Foreign Application Priority Data

Apr. 22, 1988 [JP] Japan .................. 63-100685

[51] Int. Cl.[5] ............... H03K 5/00; G01R 19/22
[52] U.S. Cl. ................... 307/261; 307/351; 307/519; 307/520; 328/140
[58] Field of Search ........... 307/261, 234, 518, 519, 307/520, 351; 328/36, 140

[56] References Cited

U.S. PATENT DOCUMENTS

| 3,336,041 | 5/1968 | Beli . | |
|---|---|---|---|
| 3,506,848 | 4/1970 | Beurrier | 307/351 |
| 3,529,247 | 9/1970 | Nelson | 307/519 |
| 3,535,658 | 10/1970 | Webb | 307/261 |
| 3,609,395 | 9/1971 | Jania | 307/261 |
| 3,784,845 | 1/1974 | Haas | 307/519 |
| 3,885,168 | 5/1975 | Matsuzaki | 307/519 |
| 4,160,922 | 7/1979 | Rickenbacker | 307/261 |
| 4,241,455 | 12/1980 | Eibner | 307/351 |
| 4,243,940 | 1/1981 | Ruof | 307/519 |

FOREIGN PATENT DOCUMENTS 3134630  3/1983  Fed. Rep. of Germany .
53-087276  8/1978  Japan .
56-057961  5/1981  Japan .

OTHER PUBLICATIONS

Elektrotechnik, vol. 58, No. 18, Sep. 17, 1976, Wurzburg, DE, pp. 26-26; G. Harms; "Grundlagen und Praxid der Linear Verstarker (Folge 31)".
U. Tietze, Ch. Schenk: "Halbletter-Schaltungstechnik (5, Auflage)", 1980, Springer Verlag, Berlin, DE.

Primary Examiner—John Zazworsky
Attorney, Agent, or Firm—Bachman & LaPointe

[57] ABSTRACT

A signal processing system employs a triangular signal generator for generating an alternating polarity triangular signal having a positive and negative peak level which is variable depending upon the pulse period of a rectangular pulse signal. A direct current voltage signal is generated to have a voltage level proportional to the amplitude of the triangular signal.

17 Claims, 23 Drawing Sheets

SIGNAL PROCESSING SYSTEM FOR PERIOD-TO-VOLTAGE CONVERSION

BACKGROUND OF THE INVENTION

1. Field of the Invention

The present invention relates generally to a signal processing system for performing period-to-voltage conversion for converting rectangular pulse train form signal into a voltage signal having a signal level variable depending upon a period of the rectangular pulses. More specifically, the invention relates to a signal processing technology for avoiding influence of noise in period-to-voltage conversion.

2. Description of the Background Art

In the automotive suspension technologies, there have been proposed various suspension control systems which can control suspension characteristics for damping and for absorbing vibration energy for achieving both riding comfort and driving stability. In order to accomplish this, it is essential to precisely monitor the relative displacement between the vehicle bodies and the road wheels rotatably supported by means of suspension members, such as suspension arms, suspension links and so forth. Some of the sensors employed for monitoring the relative distance between the vehicle bodies and the road wheels are designed to produce signals having pulse widths which are variable depending upon the monitored distances. When such type of sensor is employed in a suspension control system, it becomes necessary to provide a period-to-voltage converter circuit for converting the relative distance indicative pulse period into a voltage signal for indicating the data of relative distance by signal voltage level.

For example, Japanese Patent First (unexamined) Publications (Tokkai) Showa 53-87276 and 56-57961 disclose signal processing systems for performing the period-to-voltage operation. The system disclosed in Tokkai Showa 53-87276, is provided with a wave shaping circuit for shaping an input signal into a constant level rectangular pulse train. The period of each rectangular pulse is detected by a period detector circuit. The period detector circuit detects the leading edge of the rectangular pulse to produce a pulse signal. A saw tooth signal generator receives the pulse signal generated by the period detector circuit to be reset and generates a saw tooth wave signal having a peak level variable depending upon the resetting interval. The saw tooth wave signal of the saw tooth signal generator is fed to a sample/hold circuit which samples the saw tooth signal and holds the saw tooth signal level at the occurrence of the reset pulse of the period detector circuit. The output of the sample/hold circuit is fed to a low-pass filter which removes a ripple contained in the sample/hold output. The low-pass filter output is fed as the period-to-voltage converted output.

The period detector circuit normally comprises a resistor, a capacitor, a diode and logic circuit. On the other hand, the saw tooth generator circuit comprises a bootstrap circuit and the sample/hold circuit comprises an input pulse synchronization type sample/hold circuit. Such circuit construction encounters the problems set out herebelow.

The saw tooth signal generator circuit causes an abrupt voltage drop as a result of the reset by the reset pulse which causes an abrupt variation of current and the creation of noise. The noise created by the saw tooth signal generator circuit tends to be propagated to associated circuits to cause malfunction of the associated circuit components in the worst case. Furthermore, the saw tooth signal generator and the sample/hold circuit has to be accurately synchronized to each other to obtain an accurate conversion operation. This clearly requires a timing pulse and thus requires a clock generator which is capable of generating a synchronization pulse. The necessity of an additional clock or synchronization pulse generator necessarily causes an increase in the cost.

On the other hand, Tokkai Showa 56-57961 discloses a period-to-voltage converter circuit which converts the rectangular wave form input signal into saw tooth wave signal. The saw tooth wave signal is converted into a direct current signal by an averaging circuit. This circuit also has the drawback of generating an OFF-set noise which is contained in the former publication.

SUMMARY OF THE INVENTION

Therefore, it is an object of the present invention to provide a signal processing system which can convert rectangular a pulse period into a voltage signal with successful suppression of noise.

Another object of the invention is to provide a signal processing system for performing period-to-voltage conversion with simplified circuit construction and lower cost.

In order to accomplish the aforementioned and other objects, a signal processing system according to the present invention employs a triangular signal generator for generating an alternating polarity triangular signal having positive and negative peak levels which are variable depending upon the pulse period of a rectangular pulse signal. A direct current voltage signal is generated to have a voltage level proportional to the amplitude of the triangular signal.

According to one aspect of the invention, a signal processing system for converting a constant amplitude and variable period periodic signal into a voltage signal, comprises:

a triangular signal generator circuit for receiving the periodic signal and for converting the periodic signal into a triangular signal having an amplitude corresponding to the period of the periodic signal; and a direct current generator circuit for receiving the triangular signal and for producing a direct current voltage signal having a voltage level variable in proportion to the amplitude of the triangular signal.

The signal processing system performs a period-to-voltage conversion for a rectangular pulse train. Preferably, the triangular signal generator circuit comprises an integrator circuit for integrating the periodic signal to generate the triangular pulse signal. The direct current generator circuit comprises a peak detector circuit for detecting a peak level of the triangular signal and for producing a direct current signal having a signal level corresponding to the peak level of the triangular signal. The direct current generator circuit further comprises an amplifier for receiving the direct current signal from the peak detector circuit and for amplifying the direct current with predetermined output characteristics for outputting the direct current voltage signal.

The amplifier circuit may further operate to remove a ripple component superimposing on the direct current signal of the peak detector circuit. In addition, the output characteristics are variable according to a predetermined schedule.

The peak detector circuit may include a switching transistor having a predetermined base-emitter voltage drop and means for compensating for the base emitter voltage drop. The compensating means may comprise a normally conductive transistor arranged in complementary fashion with respect to a switching transistor.

In an alternative embodiment, the direct current generator circuit comprises a full-wave rectification circuit for receiving the triangular signal and producing a full-wave rectified signal, and an amplifier circuit for amplifying the full-wave rectified signal to output the direct current voltage signal. The full-wave rectification circuit may comprise a half-wave rectification circuit and a summing amplifier. According to another aspect of the invention, a signal processing system for converting a constant amplitude and variable period periodic signal into a voltage signal, comprises:

a first converter means for receiving the periodic signal and converting the periodic signal into a first converted signal having a continuous signal level increasing cycle and a signal level decreasing cycle and defining upper and lower peak levels which appear in each cycle of the periodic signal, the upper and lower peak levels defining an amplitude of the first converted signal, which amplitude is variable corresponding to the period of the periodic signal; and a second converter means for receiving the first converted signal and for producing a direct current voltage signal having a voltage level variable in proportion to the amplitude of the triangular signal.

BRIEF DESCRIPTION OF THE DRAWINGS

The present invention will be understood more fully from the detailed description given herebelow and from the accompanying drawings of the preferred embodiment of the invention, which, however, should not be taken to limit the invention to the specific embodiment but are for explanation and understanding only.

In the drawings.

DESCRIPTION OF THE PREFERRED EMBODIMENT

Figure 1:
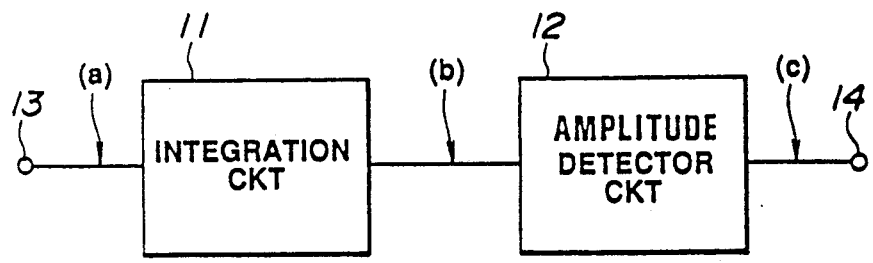
FIG. 1 is a block diagram showing the basic or fundamental idea of a signal processing system according to the present invention.

Referring now to the drawings, particularly to FIG. 1, a signal processing system, according to the present invention generally comprises an integration circuit 11 and an amplitude detector circuit 12. The integration circuit 11 is connected to an input terminal 13 which is connected to a signal source (not shown). In the shown embodiment, the signal source supplies a constant amplitude and variable period rectangular pulse train signal, in which each component pulse has a variable period representing data. The rectangular pulse train signal Vin(Va) is inputted to the integration circuit 11 via the input terminal 13. The integration circuit 11 continuously or periodically integrates the signal level of each component pulse of the rectangular pulse train signal to produce a triangular signal Vb. Since the component pulses of the rectangular pulse train signal have constant amplitude, an amplitude of the triangular signal Vb represented by a difference between the positive peak level and the negative peak level is proportional to the period of the component pulses of the rectangular pulse train signal. The amplitude detector circuit 12 generates a direct current signal Vc having a signal level corresponding to the amplitude of the triangular signal Vb. The amplitude detector circuit 12 outputs the direct current signal Vc via an output terminal 14.

According to the present invention, since the level of the triangular signal Vb varies generally in linear fashion without causing any abrupt change of the signal level, no noise will be created.

Figure 2:
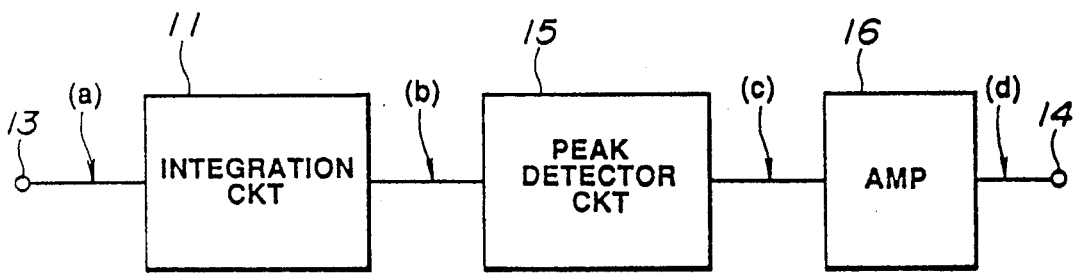
FIG. 2 is a conceptual block diagram of a first embodiment of a signal processing system for practically implementing the present invention.
Figure 3:
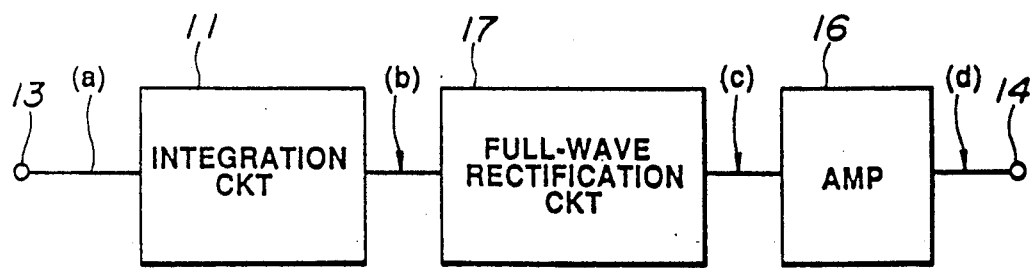
FIG. 3 is a conceptual block diagram of a second embodiment of a signal processing system for practically implementing the present invention.

FIG. 2 is a block diagram of a first embodiment of the signal processing system for practically implementing the present invention. In this embodiment, the amplitude detector circuit 12 comprises a peak detector circuit 15 and an amplifier 16. In the shown embodiment, the peak detector circuit 15 detects the peak level of the triangular signal Vb in order to output a peak signal Vd having a signal level corresponding to the detected peak level of the triangular signal Vb. The amplifier 16 receives the peak signal Vd to remove a ripple component contained in the peak signal and produces the direct current signal having a signal level corresponding to the peak signal level.

In the second embodiment of a signal processing system according to the invention, the amplitude detector circuit 12 comprises a full-wave rectification circuit 17 and the amplifier 16. The full-wave rectification circuit 17 outputs a positive polarity triangular signal having an amplitude corresponding to the top half of the triangular signal Vb. The amplifier 16 receives the full-wave rectified triangular signal to produce the direct current signal Vc having a signal level representative of the period of the component pulse.

Actual circuit constructions for implementing the aforementioned first and second embodiments of the signal processing system according to the invention will be discussed herebelow.

Figure 4:
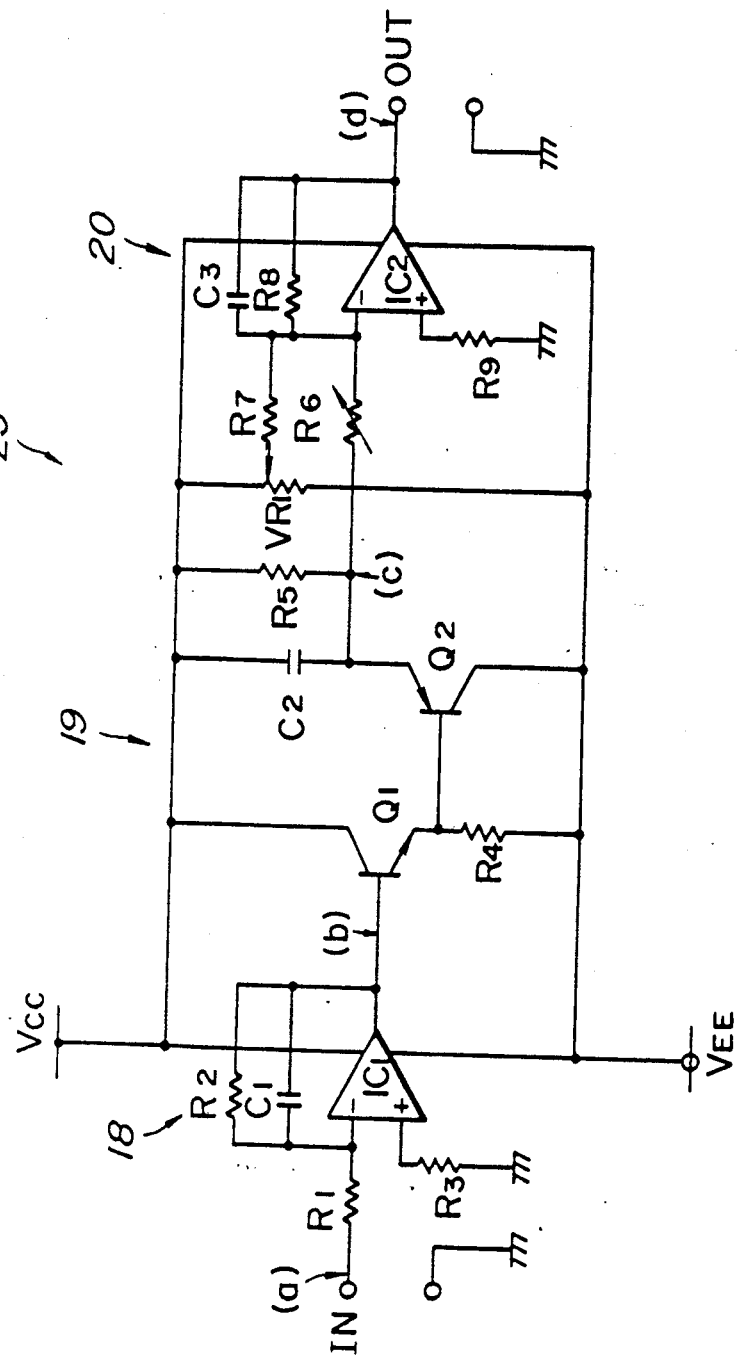
FIG. 4 is a circuit diagram of a first practical implementation of the first embodiment of the signal processing system according to the invention.

FIG. 4 is a circuit of a first implementation of the first embodiment of the signal processing system according to the present invention. The shown circuit comprises an integrator circuit 18, a peak detector circuit 19 and an amplifier circuit 20. The integrator circuit 18 comprises an operational amplifier $IC_1$, a capacitor $C_1$ and resistors $R_1$, $R_2$ and $R_3$. The operational amplifier $IC_1$ can comprise a general purpose operational amplifier. The capacitor $C_1$ and resistors $R_1$ and $R_2$ are for setting the integration constant. The resistor $R_3$ serves as a bias resistor for improving in-phase voltage removal ratio (CMRR).

The peak detector circuit 19 comprises an NPN type transistor $Q_1$, a PNP type transistor $Q_2$, a capacitor $C_2$ and resistors $R_4$ and $R_5$. The NPN type transistor $Q_1$ and the PNP type transistor $Q_2$ provide complementary characteristics. The capacitor $C_2$ serves detect the peak level of the triangular signal from the integrator circuit 18. The resistor $R_4$ serves as a bias resistor and the resistor $R_5$ serves as an output resistor.

The amplifier circuit 20 comprises an operational amplifier $IC_2$, a capacitor $C_3$, variable resistors $R_6$ and $VR_1$ and resistors $R_7$, $R_8$ and $R_9$. The operational amplifier $IC_2$ comprises a general purpose operational amplifier. The capacitor $C_3$ serves to absorb the ripple component. The variable resistor $R_6$ and the resistor $R_8$ define the amplification degree. The resistor $R_7$ and the variable resistor $VR_1$ serve to adjust the offset. The resistor $R_9$ is provided to serve as a bias resistor for improving an in-phase voltage removal ratio (CMRR). In addition, the capacitor $C_3$, the resistor $R_6$ and $R_8$ cooperate to form a low-pass filter.

The integrator circuit 18, the peak detector circuit 19 and the amplifier 20 are connected to a positive direct current source $V_{CC}$ and a negative direct current source $V_{EE}$.

With the period-to-voltage converting signal processing system of FIG. 4, a rectangular pulse train source is used which can generate a rectangular pulse train including a pulse component having a constant amplitude and a variable period. For example, such a rectangular pulse train generator comprises a displacement gauge disposed between a vehicle body and a suspension member supporting a road wheel in an automotive use. In this case, the displacement gauge includes a crystal oscillator circuit responsive to relative and physical displacement between the vehicle body and the suspension member for producing a periodic signal in the form of a constant amplitude and variable period rectangular pulse train. The operation of the aforementioned circuit of FIG. 4 will be discussed herebelow in terms of the period-to-voltage conversion for such a periodic signal of the displacement gauge. In the following discussion, reference will be made to FIGS. 5 and 6 which respectively show a timing chart of the operation of the signal processing system of FIG. 4 and period-to-voltage conversion characteristics.

Figure 5:
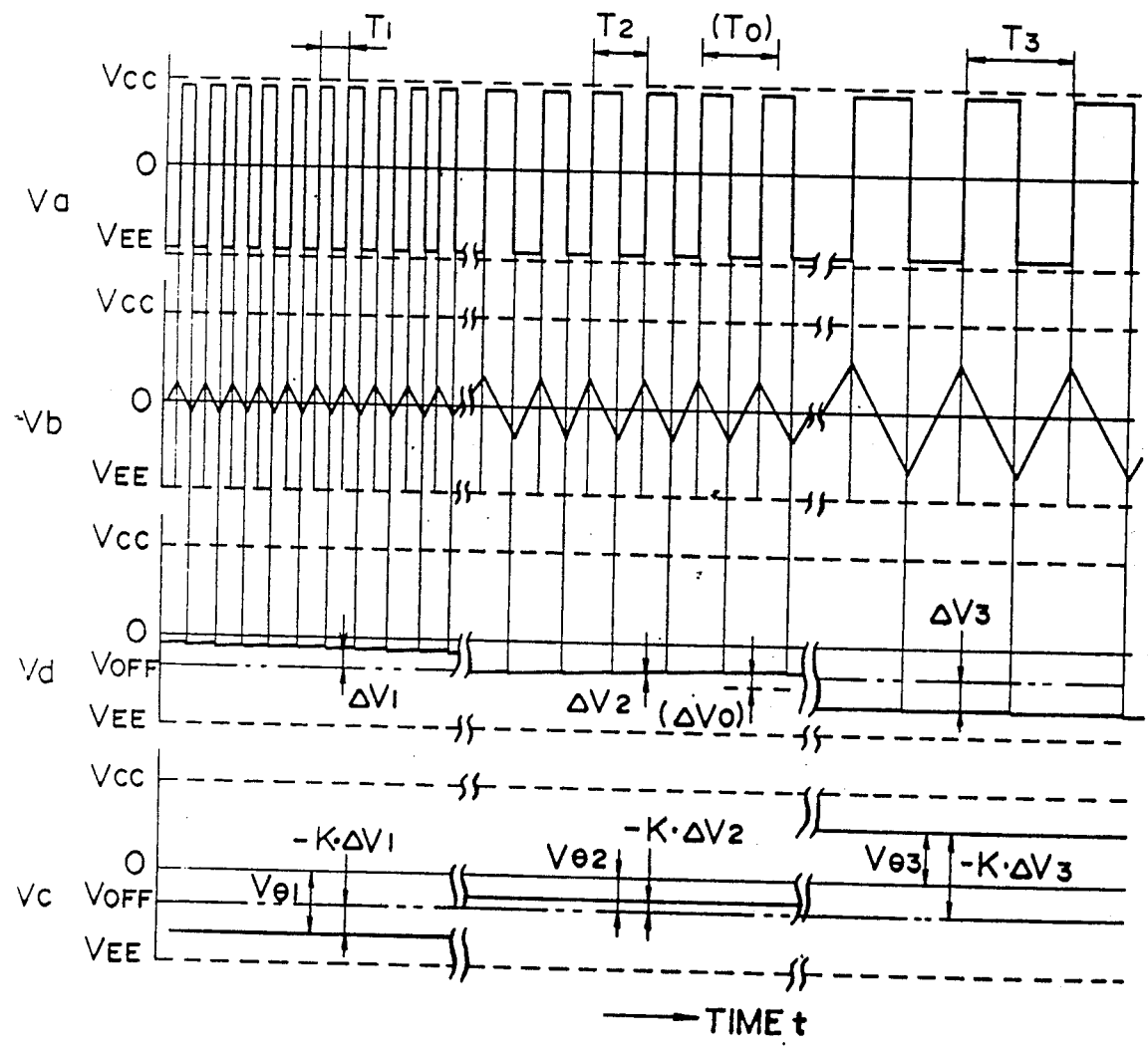
FIG. 5 is a timing chart showing the waveforms of signals in the circuit of FIG. 4.
Figure 6:
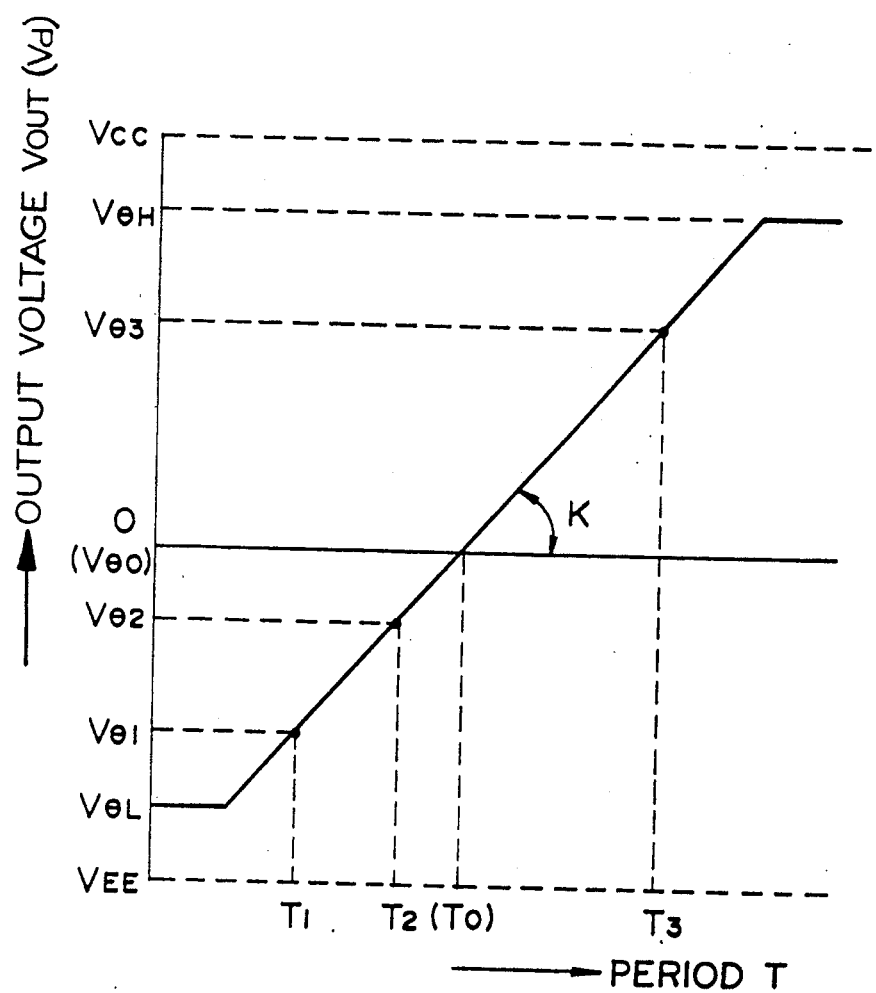
FIG. 6 is a chart showing the input and output of the circuit of FIG. 4.

As seen from FIG. 5(a), the periodic signal has a variable pulse period which represents the relative distance between the vehicle body and the suspension member. As seen, the periodic signal is a rectangular pulse train having a pulse component which varies the signal level between a positive constant level and a negative constant level in one pulse cycle. The duty ratio of the positive constant level period and the negative constant level period is set at 50%. In the shown example of FIG. 5, the period of pulse components varies between $T_1$, $T_2$ and $T_3$. The rectangular pulse train signal Va as the periodic signal is supplied to the inverting input terminal of the operational amplifier $IC_1$ via an input terminal IN and the resistor $R_1$. The operational amplifier $IC_1$ forms a Miller integrator together with the resistor $R_1$ and the capacitor $C_1$. The rectangular pulse train signal Va is integrated in the Miller integrator. The integrated output of the Miller integrator becomes a form of a triangular wave symmetric in positive and negative phases with respect to the ground level GND. The direct current gain $G_1$ of the operational amplifier $IC_1$ is determined by the resistance of the resistors $R_1$ and $R_2$ according to the following equation (1).

$$G_1 = -(R_2/R_1) \qquad (1)$$

The level of the triangular signal Vb can be derived through the following equation (2).

$$Vb = -\{1/(R_1 \times C_1)\} \times \int Va \, dt \qquad (2)$$

Assuming that the input signal level Va is constant, the foregoing equation (2) can be modified as:

$$Vb = -\{Va/(R_1 \times C_1)\} \times t + Va(0) \qquad (3)$$

As will be appreciated herefrom, when the input signal level Va is greater than a common voltage input at the non-inverting input terminal serving as a reference voltage, the signal level of the triangular signal Vb decreases at a constant rate. Alternatively, when the input signal level Va is smaller than the common voltage, the signal level of the triangular signal Vb increases at a constant rate. Accordingly, the amplitude of the triangular signal Vb becomes proportional to the length of the pulse period of the respective pulse component.

The output of the operational amplifier as the triangular signal Vb is fed to the peak detector circuit 19. In the shown embodiment, the peak detector circuit 19 is designed to detect the peak level of the triangular signal Vb and generate a negative level direct current signal Vd removing the ripple component. For this, the triangular signal Vb is supplied to the base electrode of the NPN type transistor $Q_1$. The collector of the transistor $Q_1$ is connected to the positive power source $V_{CC}$ and the emitter electrode is connected to the negative power source $V_{EE}$ via a resistor $R_4$. A junction between the emitter electrode of the transistor $Q_1$ and the resistor $R_4$ is connected to the base electrode of the PNP type transistor $Q_2$. The transistor $Q_2$ has the emitter electrode connected to the positive power source $V_{CC}$ via a capacitor $C_2$ and the collector electrode connected to the negative power source $V_{EE}$.

The NPN transistor $Q_1$ is constantly maintained ON state. The NPN transistor $Q_1$ has a base-emitter voltage drop $V_{BE1}$. Therefore, the potential at a junction E between the emitter electrode and the resistor $R_4R$ becomes $Vb - V_{BE1}$. The potential at the junction E is supplied to the PNP transisror $Q_2$ which has a base-emitter voltage drop $V_{BE2}$. The transistor $Q_2$ is maintained ON while the signal level of the triangular signal Vb is decreasing. By this a circuit between the positive power source $V_{CC}$ and the negative power source $V_{EE}$ via the capacitor $C_2$ is established to charge the negative potential. The capacitor $C_2$ is charged at a charge level until the following equation (4) is satisfied:

$$Vd = Vb - V_{BE1} + V_{BE2} \qquad (4)$$

wherein $V_{BE2}$ is the voltage drop between the base electrode and the emitter electrode of the transistor $Q_2$.

Because the transistors $Q_1$ and $Q_2$ are provided complementary characteristics, the voltage drops $V_{BE1}$ and $V_{BE2}$ are equal to each other. Therefore, in the foregoing equation (4), the voltage drops $V_{BE1}$ and $V_{BE2}$ are cancelled. The potential Vd at a junction F between the emitter electrode of the PNP transistor $Q_2$ and the capacitor $C_2$ thus becomes equal to the output level Vb. When the triangular signal level Vb reaches the negative peak and thus turns to increase the signal level, the base-emitter voltage drop $V_{BE2}$ cannot be maintained to turn the PNP transistor $Q_2$ OFF. Therefore, the capacitor $C_2$ is not further charged to maintain the negative level charge level corresponding to the negative peak level of the triangular signal. While the PNP transistor $Q_2$ is maintained in the OFF position, the negative charge in the capacitor $C_2$ is discharged through the resistor $R_5$. The charge level at a point C is gradually increased to reduce the negative level, as shown in FIG. 5(c). The capacity of the capacitor and the resistance of the resistor $R_5$ are selected to provide a predetermined time constant for the negative peak level of the subsequent next pulse component.

It should be appreciated that, in the shown embodiment, the resistor $R_4$ serves to control the base current in the base electrode of the PNP transistor $Q_2$ so that excessive collector current can be prevented. Therefore, by appropriately selecting the resistance of the resistor $R_4$, the PNP transistor $Q_2$ is protected from malfunctioning.

The direct current signal Vd representative of the negative peak level of the triangular signal Vb, which has a negative level corresponding to the negative peak of the triangular signal, is the output from the peak detector circuit 19. The direct current signal Vd is supplied to an inverting input terminal of the operational amplifier $IC_2$ via the variable resistor $R_6$. By the operational amplifier $IC_2$, the direct current signal Vd is inverted and amplified. Therefore, the direct current form signal Vc which varies in an alternative direction to the direction of variation of the direct current signal Vd, is outputted from the operational amplifier $IC_2$, as shown in FIG. 5(d).

In the shown embodiment, the operational amplifier $IC_2$ is provided an amplifier gain $G_2$ which is determined by the resistances of the resistors $R_6$ and $R_8$. The gain $G_2$ is determined by the following equation:

$$G_2 = -(R_8/R_6)$$

As seen from FIG. 5(d), the direct current signal Vd is offset by a predetermined offset voltage which is determined by the variable resistor $VR_1$ and the resistor $R_7$. Namely, as seen from FIG. 6, according to the shown embodiment, the characteristics of the direct current signal Vc as a period-to-voltage conversion output signal $V_{out}$ can be controlled by setting resistances of the variable resistors $R_6$ and $VR_1$ and the resistor $R_7$. Furthermore, the resistors $R_6$ and $R_8$ and the capacitor $C_3$ form the low-pass filter for removing the ripple component.

As seen from FIGS. 5(c) and 5(d), when the direct current signal level varies between $\Delta V_1$, $\Delta V_2$ and $\Delta V_3$ with respect to the pulse period $T_1$, $T_2$ and $T_3$, the offset of the output signal level from the offset voltage can be illustrated by $-k\Delta V_1$, $-k\Delta V_2$ and $-k\Delta V_3$, wherein k is an amplification ratio. With the offset voltage, the output signal becomes $V_{\theta 1}$, $V_{\theta 2}$ and $V_{\theta 3}$.

By utilizing the foregoing circuit, the saw tooth signals which are used in the prior proposed signal processing systems are not used. Instead, they are replaced with a triangular signal which varies signal level gradually. As a result, noise may not be created in the system. Therefore, malfunction in the circuit components of the signal processing system can be successfully avoided. Furthermore, the shown construction of the circuit enables avoidance of a timing pulse to allow the circuit construction to be significantly simplified.

Since the shown circuit construction has NPN transistor $Q_1$ and PNP transistor $Q_2$ arranged in complementary characteristics, any temperature dependent variation of characteristics can be successfully cancelled. Furthermore, by the operation of the bias resistor $R_4$, excess current flow on the collector electrode of the PNP transistor $Q_2$ can be prevented.

In addition, since the shown embodiment permits variation of output characteristics by appropriately selecting the resistance of the variable resistors $R_6$ and $VR_1$ and the resistor $R_7$, the range of application of the shown construction of the signal processing system can be substantially widened. Furthermore, because of the low-pass filter which is implemented by the combination of the resistors $R_6$ and $R_7$ and the capacitor $C_3$, suppression of the ripple component in and the linear characteristics of the output signal can be obtained.

It should be noted that the foregoing circuit can be fabricated in an integrated circuit so that it can be incorporated in the displacement gauge without occupying a substantial space.

Figure 7:
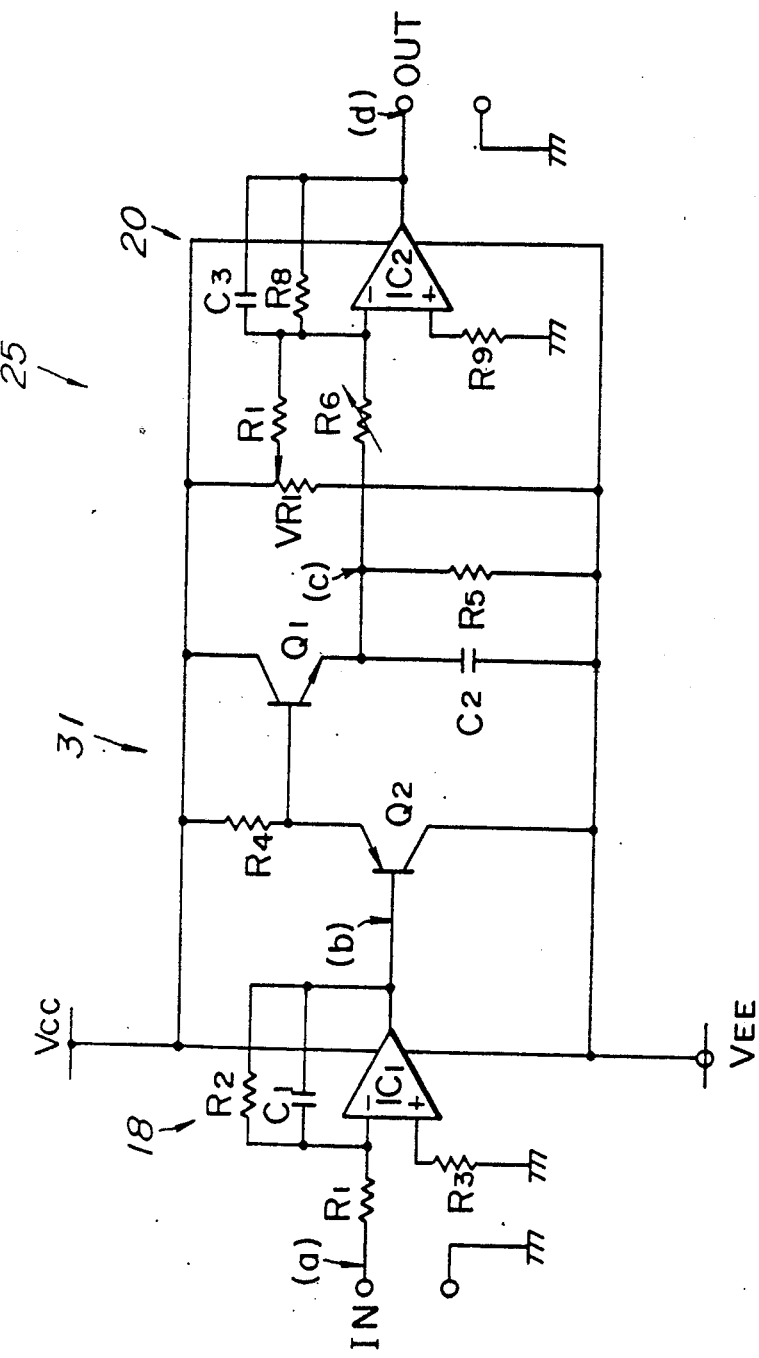
FIG. 7 is a circuit diagram of a second practical implementation of the first embodiment of the signal processing system according to the invention.
Figure 8:
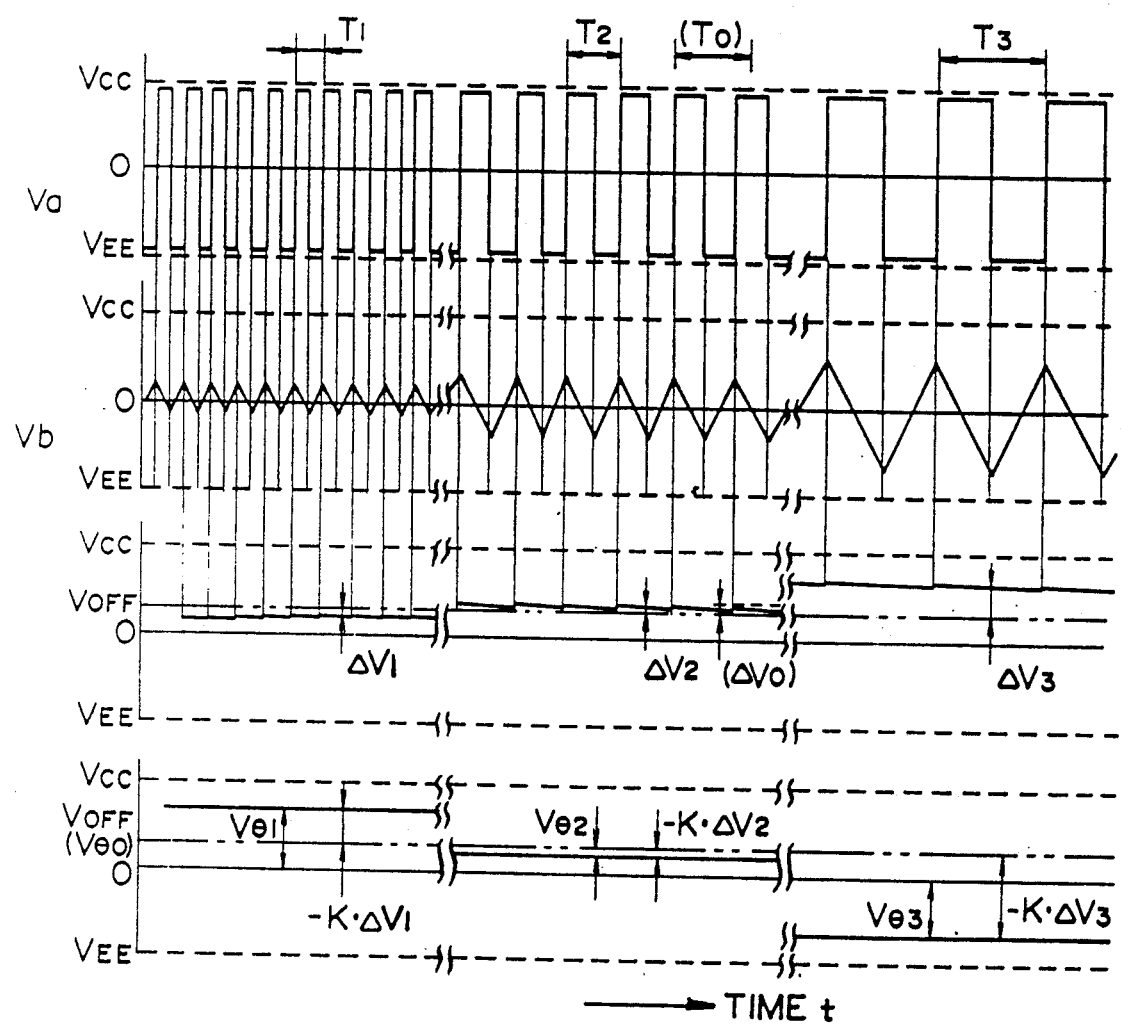
FIG. 8 is a timing chart showing the waveforms of signals in the circuit of FIG. 7.
Figure 9:
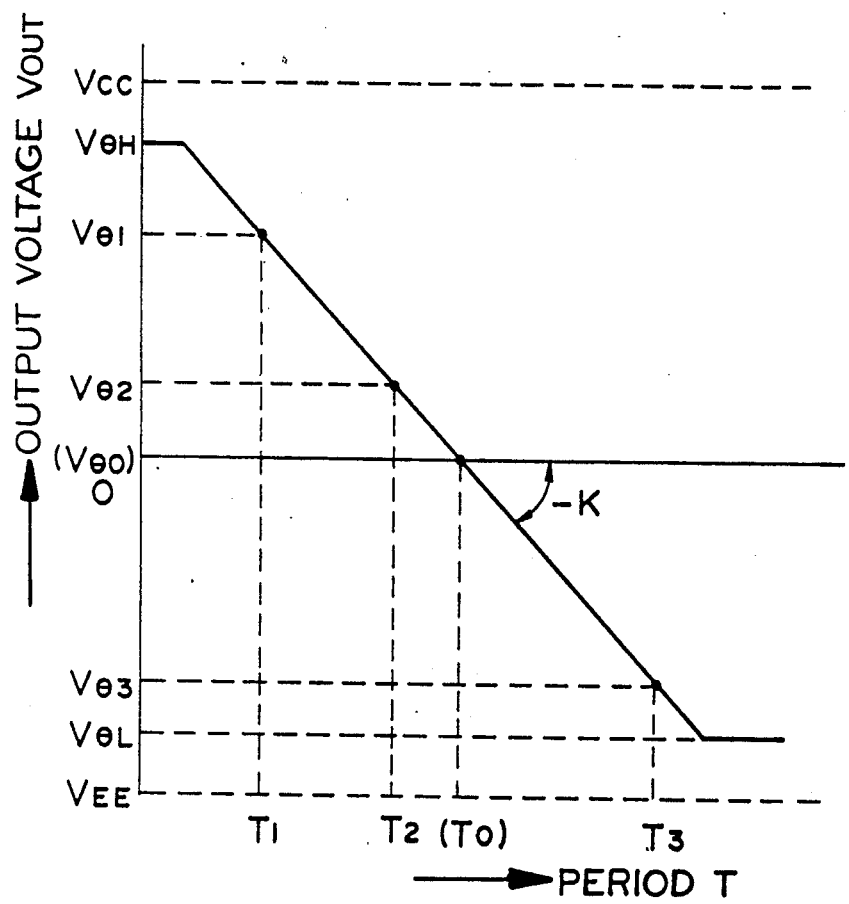
FIG. 9 is a chart showing the input and output of the circuit of FIG. 7.

FIGS. 7 through 9 show the second implementation of the first embodiment of the signal processing system according to the invention. In this second implementation, the peak detector circuit 31 is modified from the former embodiment in order to detect the positive peak level of the triangular signal Vb. As seen from FIG. 7, the peak detector circuit 31 has the PNP transistor $Q_2$ directly connected to the operational amplifier $IC_1$ of the triangular signal generator circuit 18 which is of identical construction to the former embodiment. The peak detector circuit 31 also has the NPN transistor $Q_1$ connected to a junction G between the emitter electrode of the PNP transistor $Q_2$ and the resistor $R_4$. Even in this arrangement, the complementary characteristics of the base-emitter voltage drop of the transistors $Q_2$ and $Q_1$ can be established.

The offset voltage in the amplifier circuit 20 is modified to provide the characteristics of FIG. 9 by modifying the setting of the variable resistor $VR_1$ and the resistor $R_7$.

In the shown circuitry, because of the complementary characteristics of the base-emitter voltage drop in the PNP and NPN transistors $Q_2$ and $Q_1$, the voltage drop components can be cancelled. Therefore, a signal level at a junction H between the emitter electrode of the NPN transistor $Q_1$ and the capacitor $C_1$ substantially corresponds to the signal level of the triangular signal Vb generated by the triangular signal generator circuit 18.

In the shown circuit arrangement, the PNP transistor $Q_2$ is normally or constantly maintained in an ON state to supply the signal having a level (Vb+$V_{BE2}$) to the NPN transistor $Q_2$. The NPN transistor $Q_1$ is maintained in an ON state while the signal level of the triangular signal is increasing. When the NPN transistor $Q_1$ is held ON, the capacitor $C_2$ is charged by the power supplied from the positive power source $V_{cc}$ until the charged potential reaches the level corresponding to the positive peak level of the triangular signal. When the triangular signal level decreases, the NPN transistor $Q_1$ is maintained OFF to disconnect the capacitor $C_2$ from the positive power source $V_{cc}$. During this period, the potential charged in the capacitor $C_2$ is gradually discharged through the resistor $R_5$ to lower the positive signal level as shown in FIG. 8(c). Similarly to the former embodiment, the direct current signal Vd output from the peak detector circuit 31 is supplied to the amplifier circuit 20. The amplifier circuit 20 then outputs the direct current from voltage signal Vc as shown in FIG. 8(d).

Figure 10:
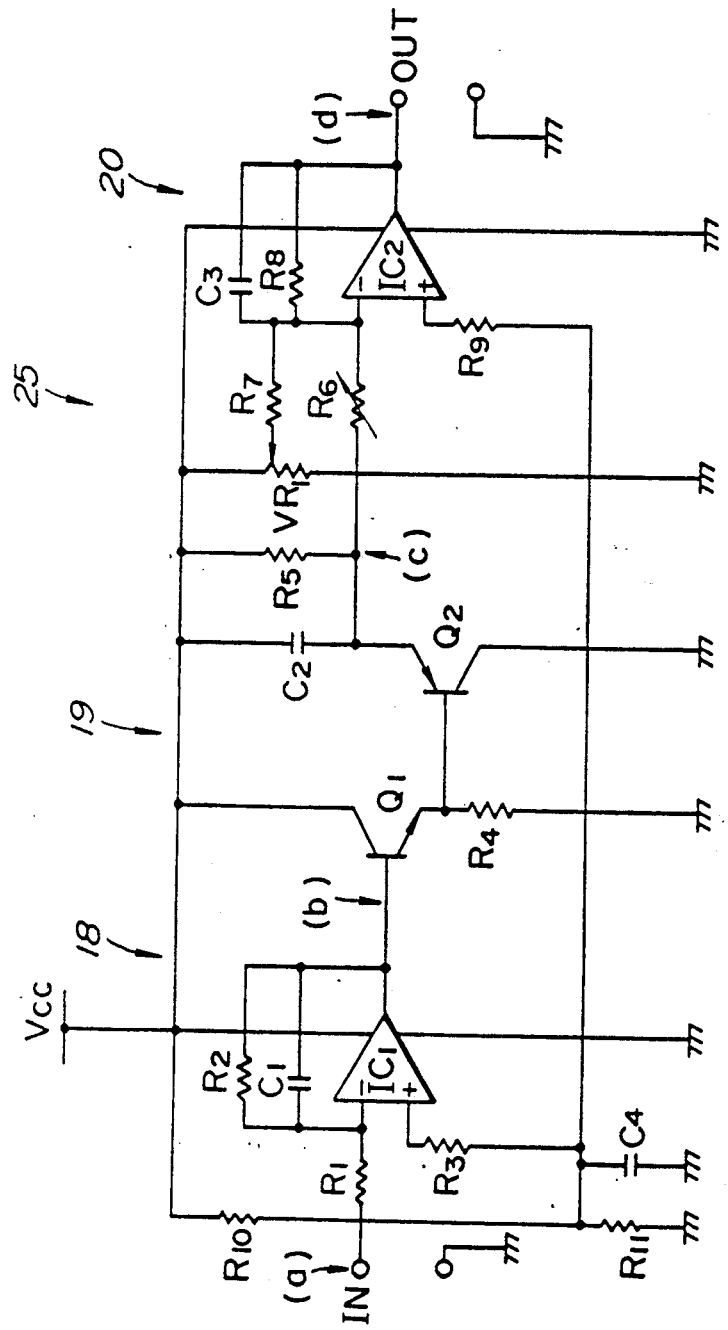
FIG. 10 is a circuit diagram of a third practical implementation of the first embodiment of the signal processing system according to the invention.
Figure 11:
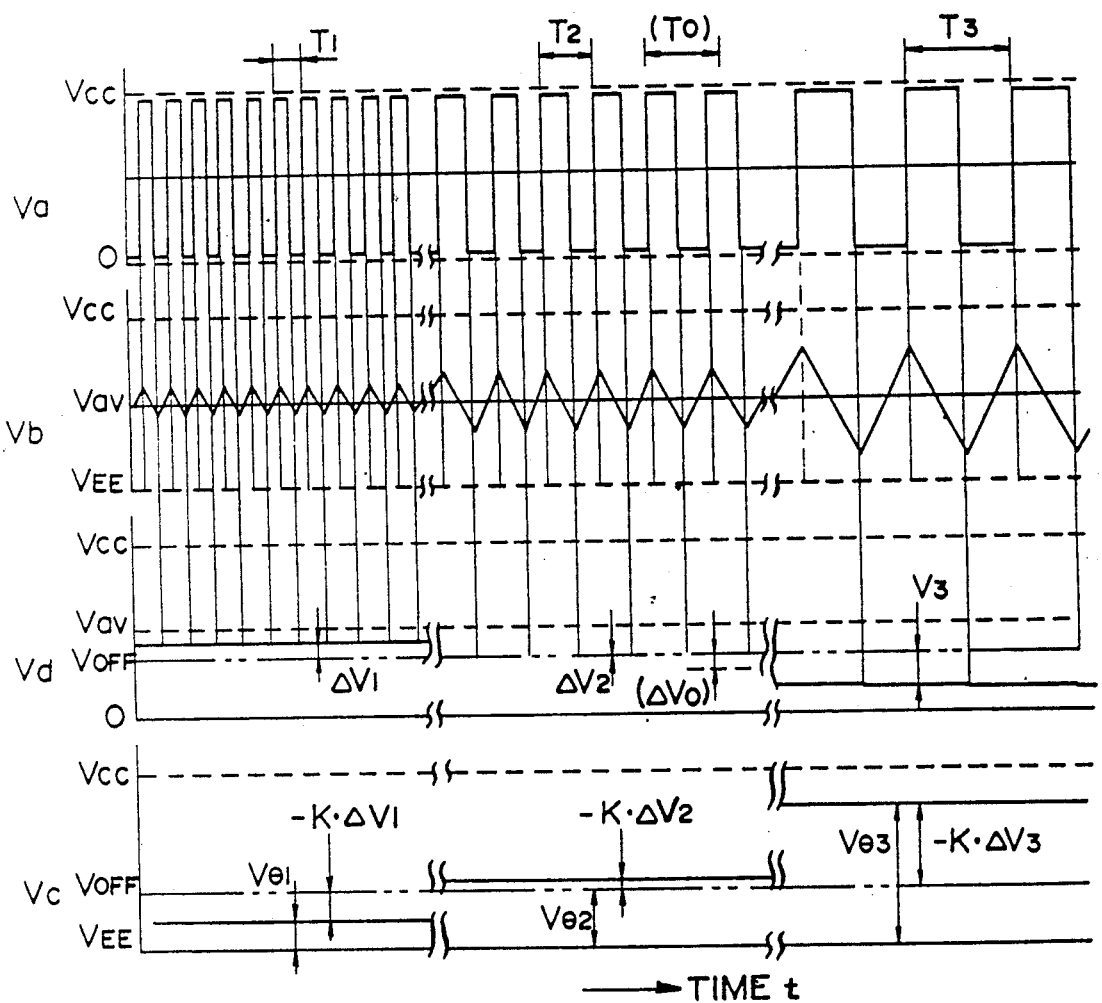
FIG. 11 is a timing chart showing the waveforms of signals in the circuit of FIG. 10.

FIGS. 10 and 11 shows the third implementation of the first embodiment of the signal processing system according to the invention. The shown embodiment is practically a modification of the foregoing embodiment of FIGS. 4 through 6. In the shown embodiment, the power is supplied only from the positive power source $V_{cc}$. Therefore, the negative power source $V_{EE}$ in the former embodiment is replaced with the ground level GND. The shown embodiment is thus applicable for the rectangular pulse train which varies the signal level between a predetermined positive level and the ground level. In the shown embodiment, resistors $R_{10}$ and $R_{11}$ are inserted between the positive power source $V_{cc}$ and the ground level GND so as to supply the common voltage for the non-inverting input terminal of the operational amplifiers $IC_1$ and $IC_2$.

As seen from FIG. 10, a junction I between the resistors $R_{10}$ and $R_{11}$ is connected to the non-inverted input terminals of the operational amplifiers $IC_1$ and $IC_2$ via the resistors $R_3$ and $R_9$. Therefore, the common voltage supplied to each of the operational amplifiers can be illustrated by:

$$V_{COM} = \{R_{11}/(R_{10}+R_{11})\} \times V_{cc} \quad (5)$$

In addition, in the shown embodiment a capacitor $C_4$ is provided which serves as a by-pass capacitor for by-passing the noise component to be superimposed in the common voltage. Except for the signal polarities, the operation of the circuit for performing period-to-voltage conversion is substantially the same as that performed by the circuit of FIG. 4, as shown by FIG. 11.

Figure 12:
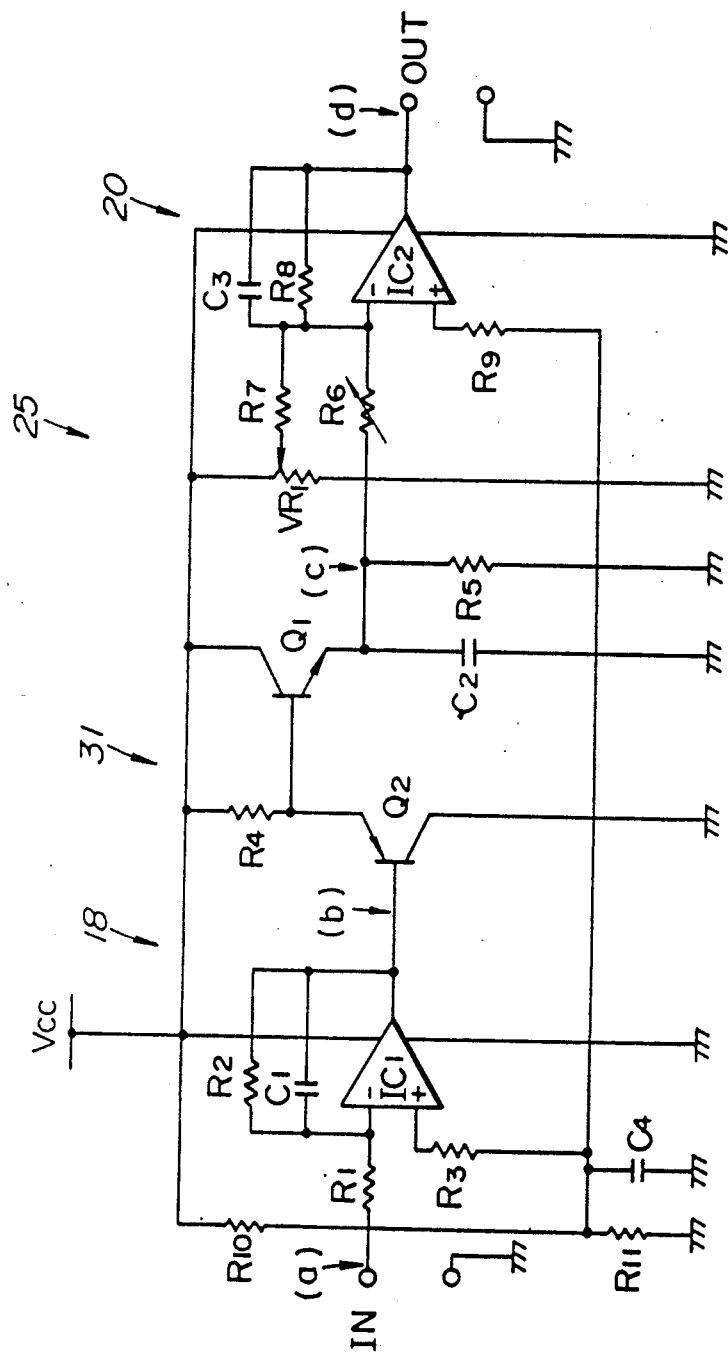
FIG. 12 is a circuit diagram of a fourth practical implementation of the first embodiment of the signal processing system according to the invention.
Figure 13:
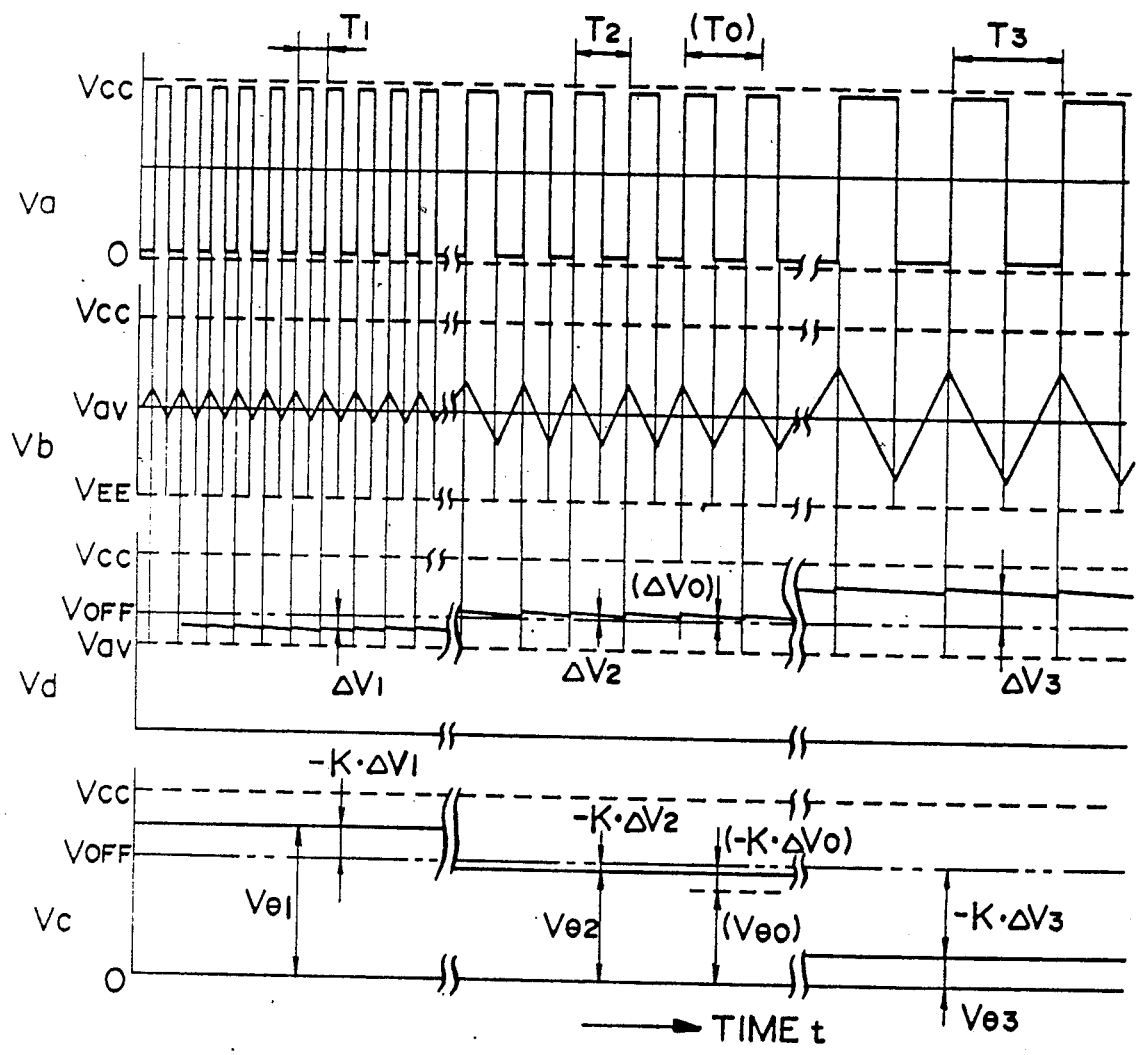
FIG. 13 is a timing chart showing the waveforms of signals in the circuit of FIG. 12.

FIGS. 12 and 13 shows the fourth implementation of the first embodiment of the signal processing system according to the invention. The shown embodiment is practically a modification of the foregoing embodiment of FIGS. 7 through 8 and applicable for the rectangular pulse train having a signal level varying between the predetermined positive level and the ground level. The circuit is provided with a single and positive power source $V_{cc}$, as shown in FIG. 12. In order to provide the common voltage $V_{COM}$ for the operational amplifiers $IC_1$ and $IC_2$, the shown embodiment is provided with additional resistors $R_{10}$ and $R_{11}$ and the by-pass capacitor $C_4$ in the same arrangement as that in the former embodiment of FIGS. 10 and 11. The waveforms of the signals at respective points a, b, c and d are shown in FIG. 13.

Figure 14:
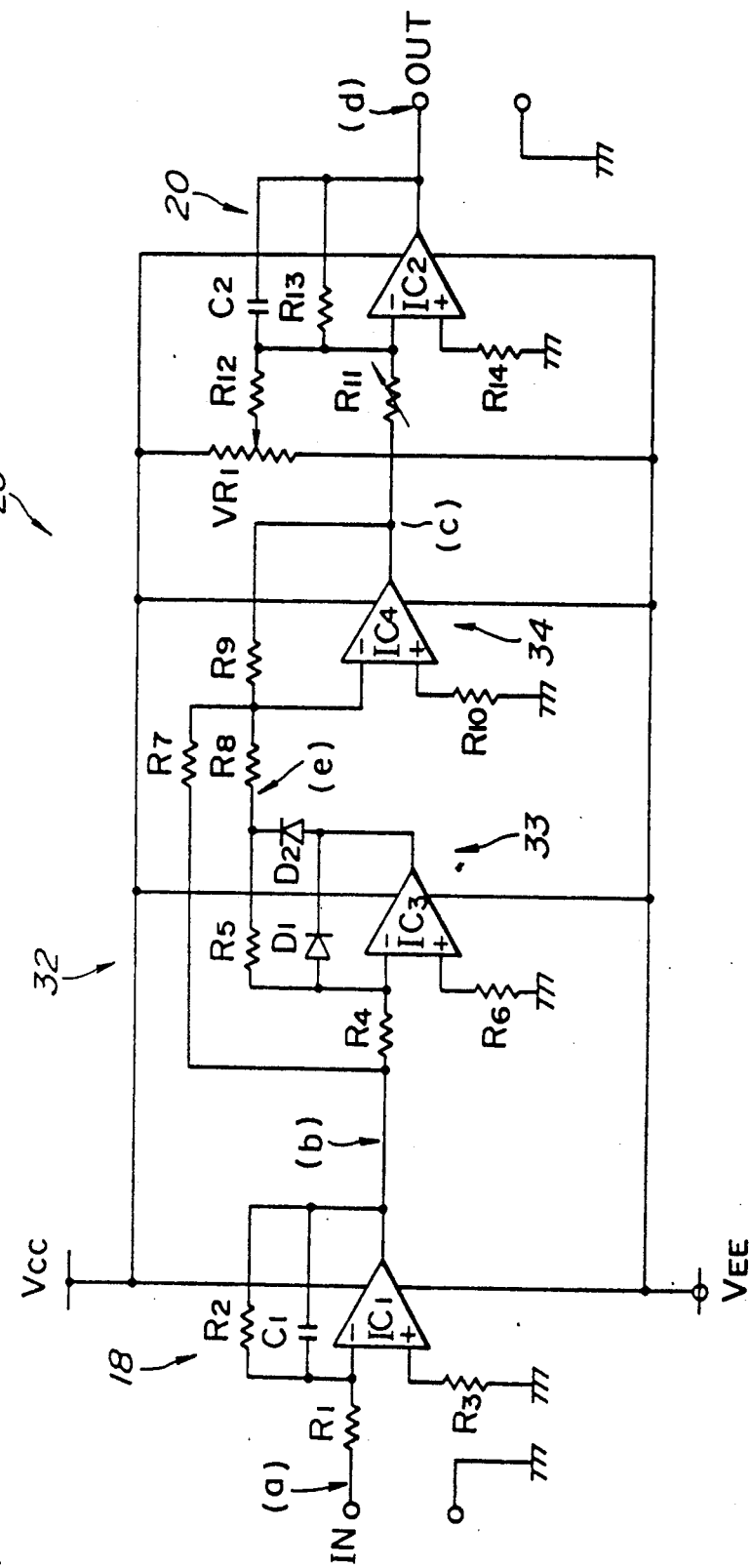
FIG. 14 is a circuit diagram of a first practical implementation of the second embodiment of the signal processing system according to the invention.
Figure 15:
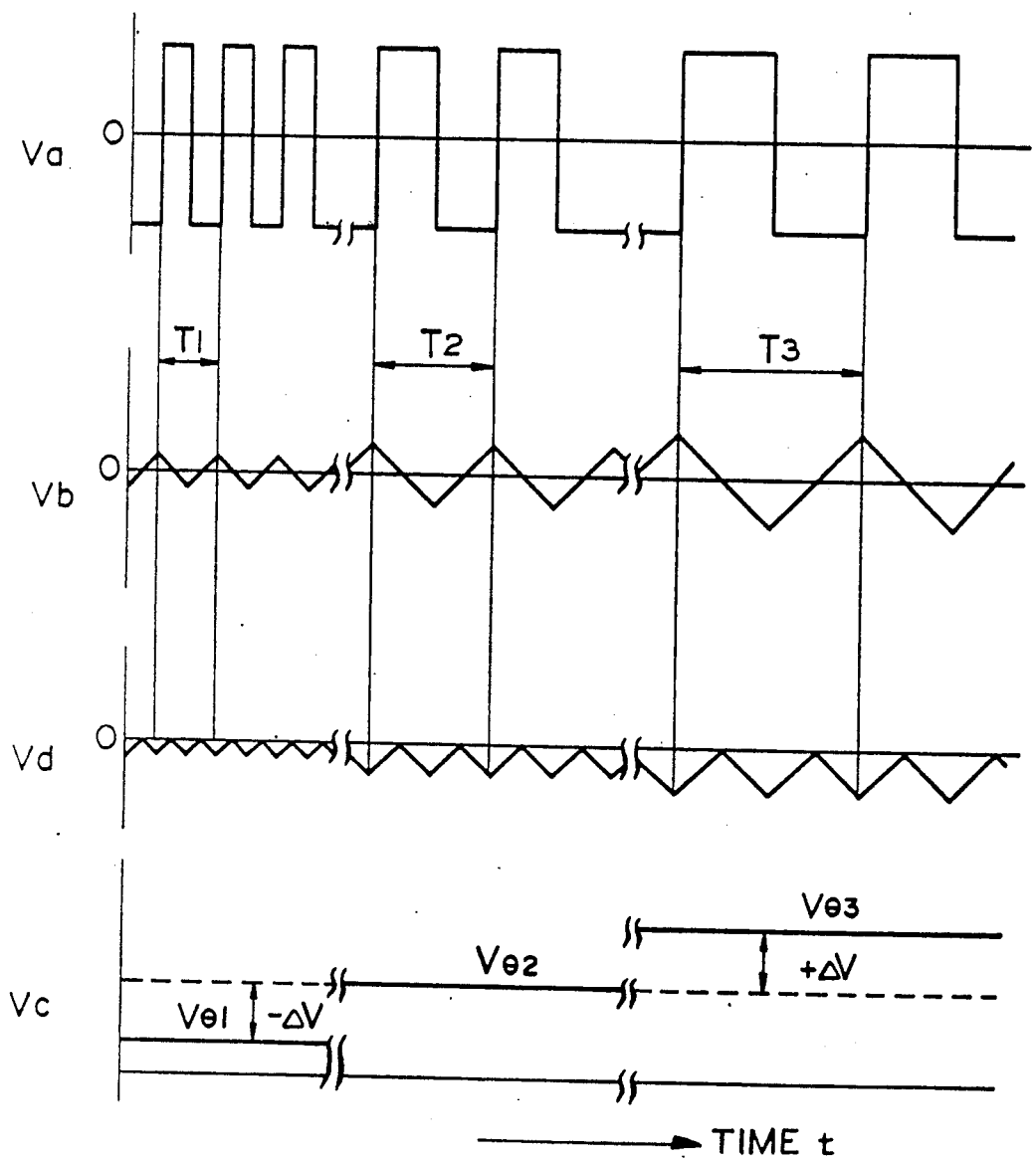
FIG. 15 is a timing chart showing the waveforms of signals in the circuit of FIG. 14.
Figure 16:
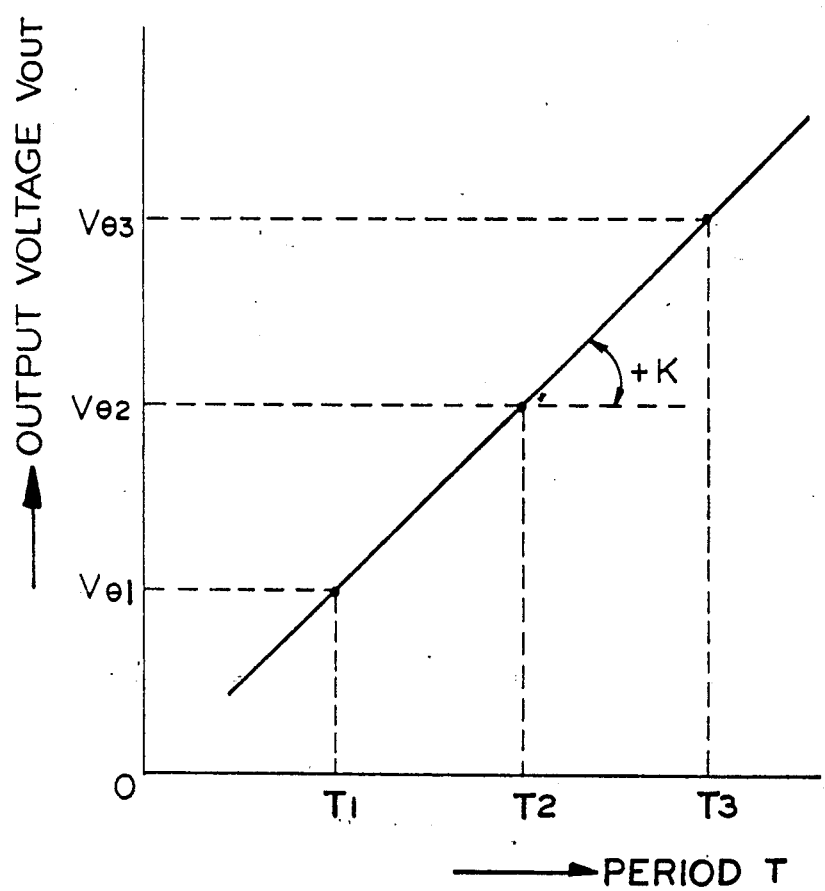
FIG. 16 is a chart showing the input and output of the circuit of FIG. 14.

FIGS. 14 to 16 show the first implementation of the second embodiment of the signal processing system according to the present invention. The shown embodiment employs the full-wave rectification circuit 32 for generating a full-wave rectified negative polarity triangular signal.

As seen from FIG. 14, the full-wave rectification circuit 32 comprises a half-wave rectification circuit 33 and a summing amplifier 34. The half-wave rectification circuit 33 comprises resistors $R_4$ and $R_5$, a diode $D_2$, and a general purpose operational amplifier $IC_3$. The diode $D_1$ serves to prevent the operational amplifier $IC_3$ from causing saturation of the input and/or output voltage. The resistor $R_6$ serves to improve the CMRR of the operational amplifier $IC_3$. The half-wave rectification circuit 33 further has a diode $D_2$ which serves for preventing the operational amplifier $IC_3$ from an input/output voltage in excess of the saturation voltage while the triangular signal level Vb is higher than zero. The summing amplifier 34 comprises resistors $R_7$, $R_8$ and $R_9$ and a general purpose operational amplifier $IC_4$. A resistor $R_{10}$ is also provided for improving the CMRR of the operational amplifier $IC_4$.

The triangular signal Vb of the triangular signal generator circuit 18 is supplied to the inverting input terminal of the operational amplifier $IC_3$ via the resistor $R_4$. The half-wave rectification circuit 33 generates a half-wave rectified triangular signal Ve. The half-wave rectified triangular signal level Ve is maintained zero while the triangular signal level is higher than or equal to zero and, assuming the resistances of the resistors $R_4$ and $R_5$ are equal to each other, varies according to the variation of the triangular signal level Vb while the polarity of the triangular signal Vb is maintained negative.

The triangular signal Vb is further supplied to the inverting input terminal of the operational amplifier $IC_4$ via the resistor $R_7$. Furthermore, the half-wave rectified triangular level Ve is supplied to the inverting input terminal of the operational amplifier $IC_4$ via the resistor $R_8$. The operational amplifier $IC_4$ thus outputs the full-wave rectified signal Vd as shown in FIG. 15(c). Assuming the resistance of the resistors $R_7$ and $R_9$ are equal to each other and are equal to double the resistance of the resistor $R_8$, the full-wave rectified signal level Vd can be illustrated by:

$$Vd = -(Vb + 2Ve) \quad (6)$$

Since the half-wave rectified triangular signal level is maintained zero while the triangular signal level Vb is maintained higher than or equal to zero and varies according to variation of the triangular signal Vb while the triangular signal Vb is smaller than zero, the following relationships between the triangular signal Vb and the full-wave rectified signal Vc are established:

when $Vb \geq 0$  $Vc = -Vb$
$Vb < 0$  $Vc = Vb$

As will be appreciated herefrom and from FIG. 15(c), the full-wave rectified signal Vd becomes a negative polarity triangular wave signal. The amplitude of the full-wave rectified signal Vd becomes half of the amplitude of the triangular signal Vb.

In the shown embodiment, the amplifier circuit 20 has the same construction as that in the first embodiment set forth above, and performs a peak hold operation for generating a direct current form voltage signal Vc having signal level corresponding to the period of the pulse period of the rectangular pulse train.

Similarly to the foregoing first embodiment, the amplifier circuit is provided variable output characteristics for varying output level in relation to the input level by adjusting the setting of resistances of the variable resistors and associated resistors, as shown in FIG. 16.

Figure 17:
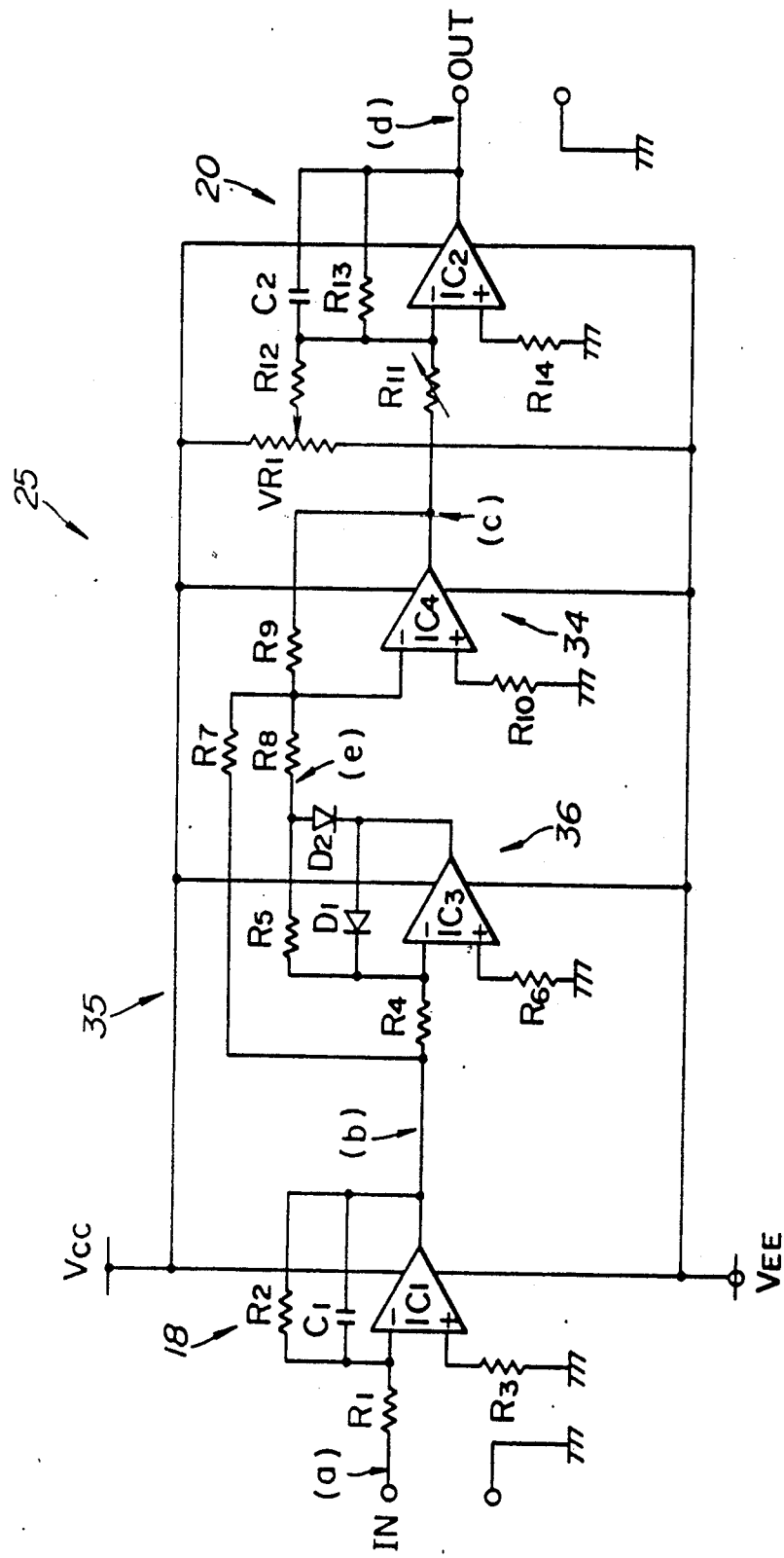
FIG. 17 is a circuit diagram of a second practical implementation of the second embodiment of the signal processing system according to the invention.
Figure 18:
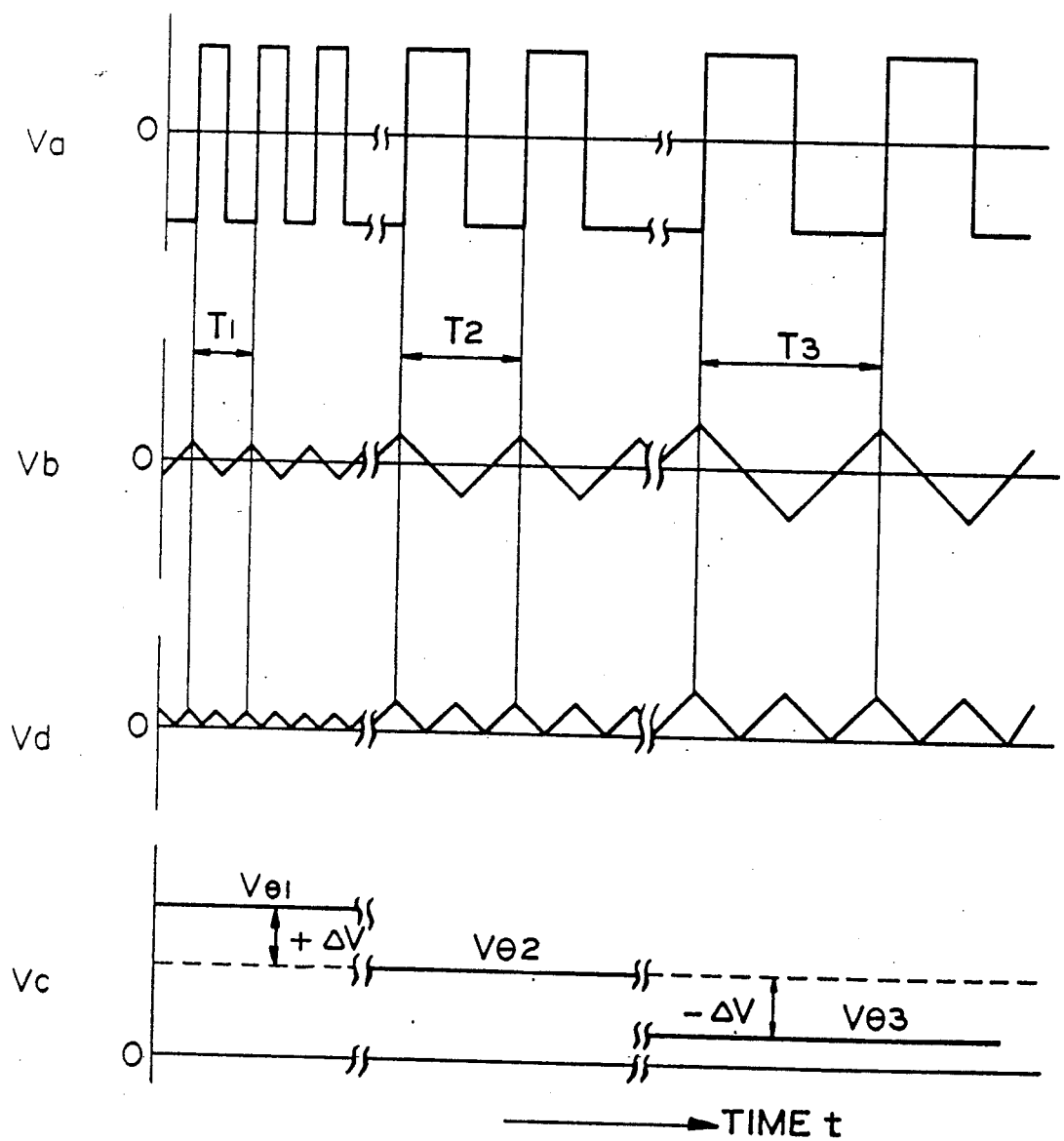
FIG. 18 is a timing chart showing the waveforms of signals in the circuit of FIG. 17.
Figure 19:
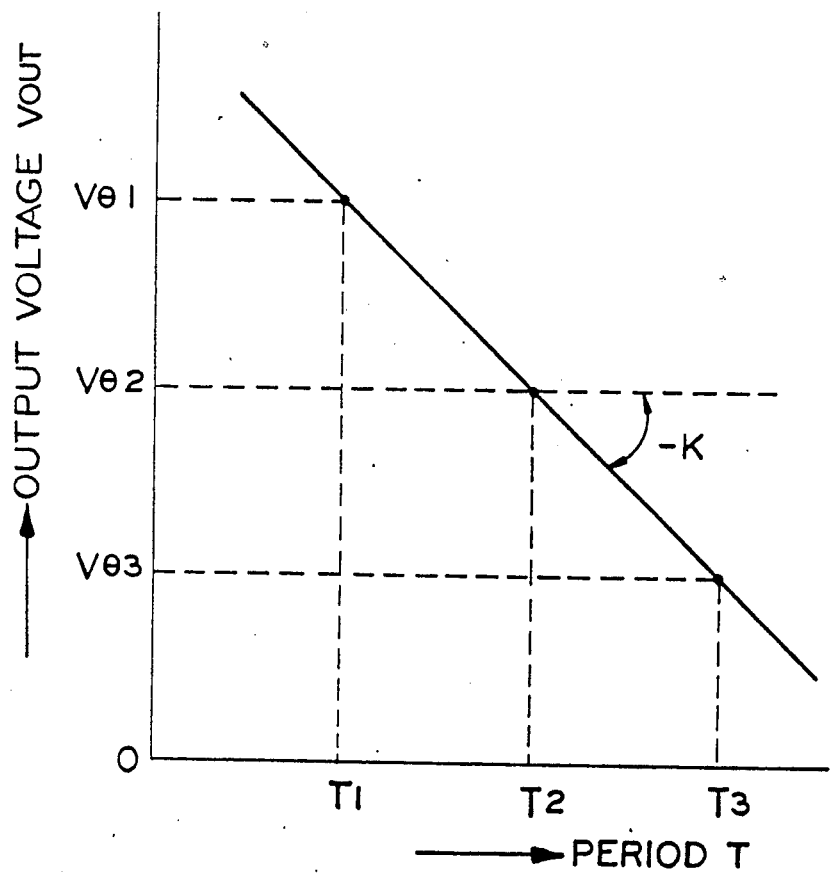
FIG. 19 is a chart showing the input and output of the circuit of FIG. 17.

FIGS. 17 through 19 show the second implementation of the second embodiment of the signal processing system according to the invention. The shown embodiment is practically derived as a modification of the former embodiment of FIGS. 14 through 16. As can be seen from FIG. 17, the circuit of the second implementation is differentiated from the former embodiment by the alternation of polarities of the diodes D₁ and D₂ and by the polarity of the full-wave rectified signal, as seen from FIG. 18. In the shown circuit arrangement, the half-wave rectified triangular signal Ve generated by the half-wave rectification circuit 36 becomes positive phase. Therefore, the full-wave rectified signal Vd as the output of the summing amplifier 34 becomes positive phase.

Figure 20:
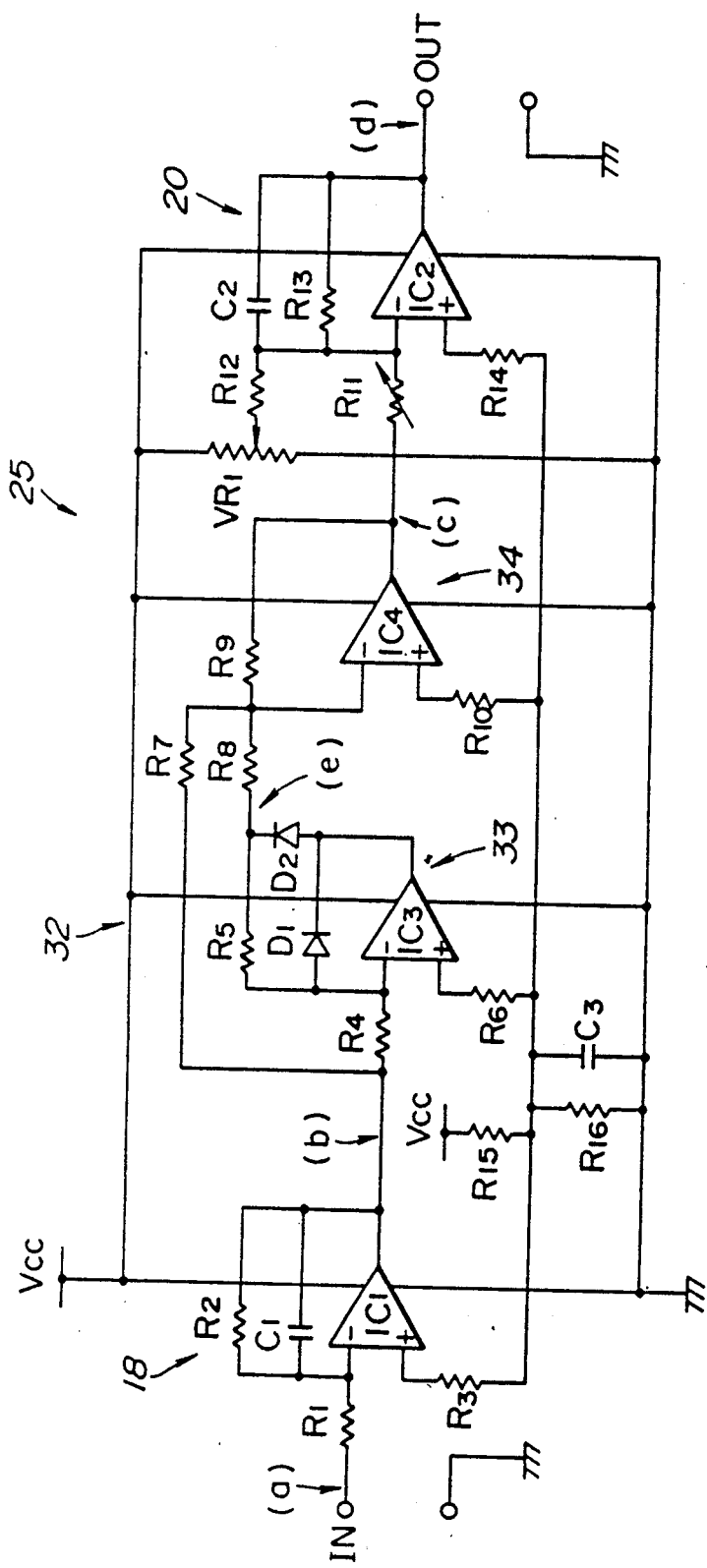
FIG. 20 is a circuit diagram of a third practical implementation of the second embodiment of the signal processing system according to the invention.
Figure 21:
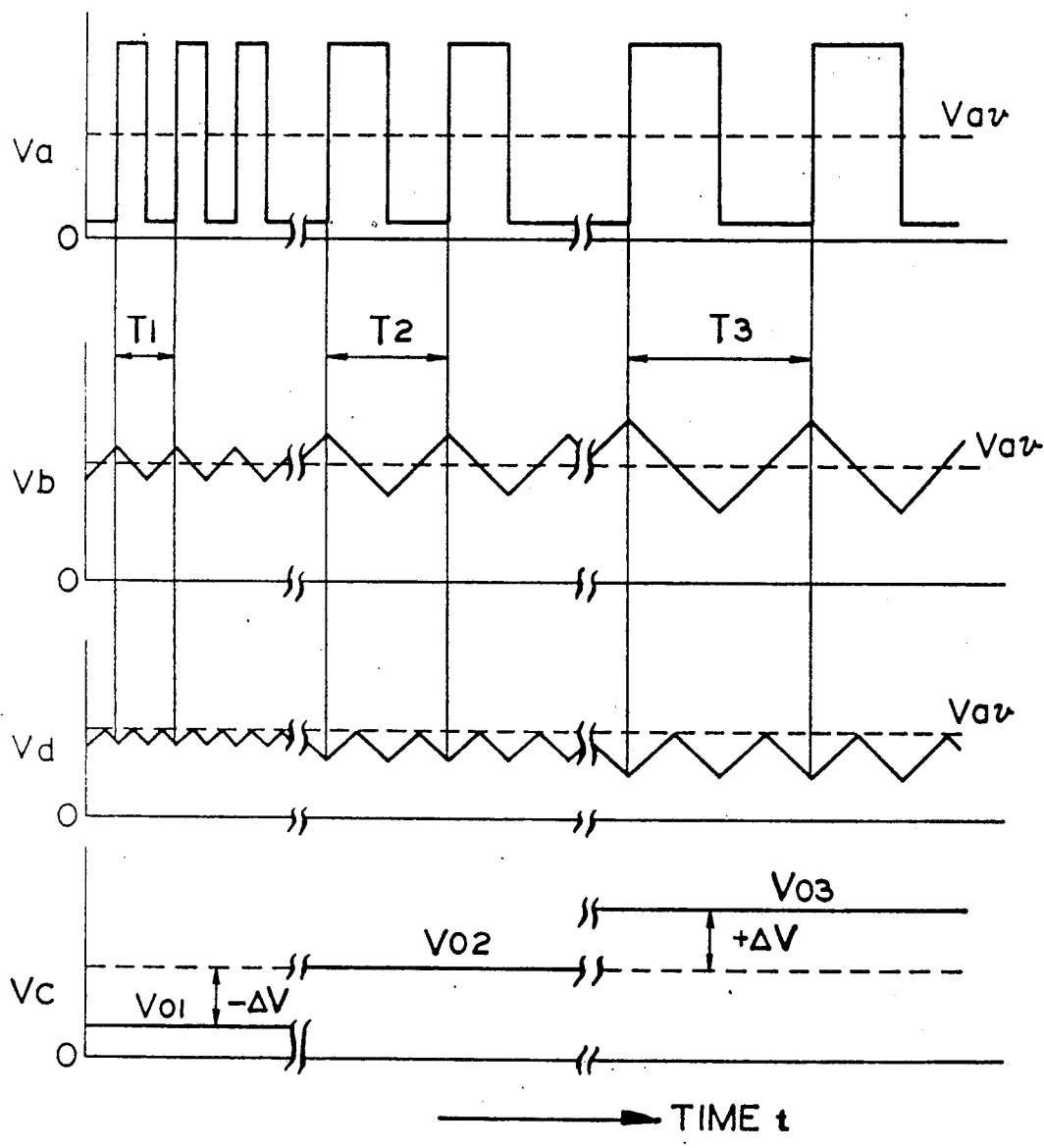
FIG. 21 is a timing chart showing the waveforms of signals in the circuit of FIG. 20.
Figure 22:
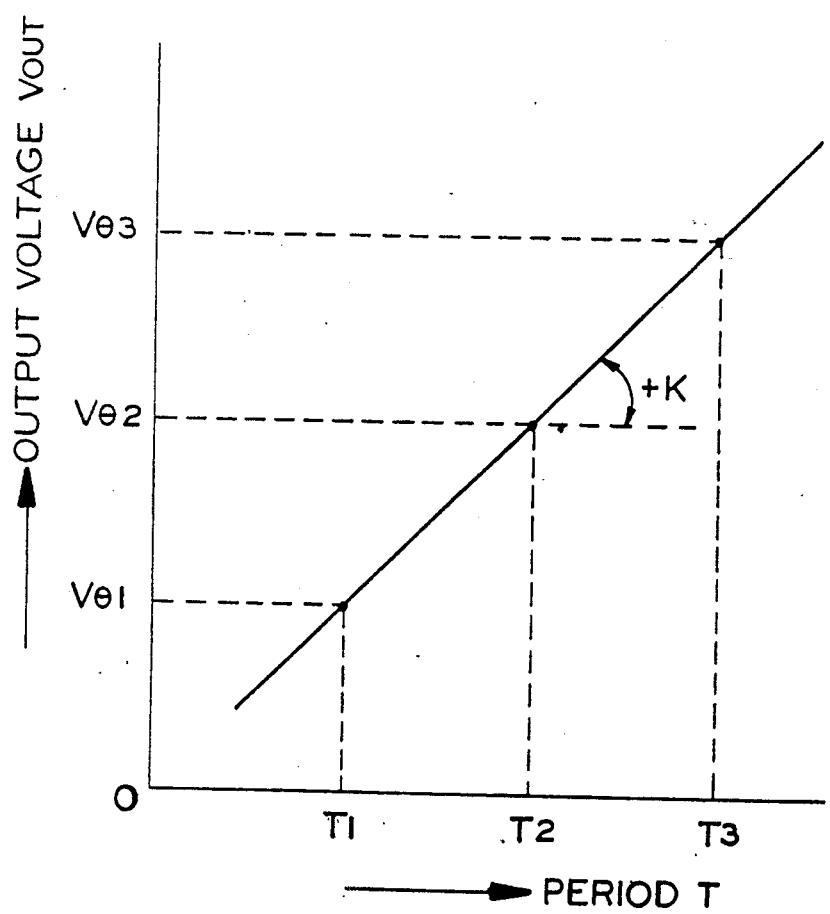
FIG. 22 is a chart showing the input and output of the circuit of FIG. 20.

FIGS. 20 through 22 show the third implementation of the second embodiment of the signal processing system according to the invention. The shown embodiment is particularly applicable for the rectangular pulse train having a signal level varying between the positive level and the ground level GND. The common voltage for respective operational amplifiers IC₁, IC₂, IC₃ and IC₄ is provided by resistors R₁₅ and R₁₆ which form a voltage divider for dividing the positive power source voltage V_cc to produce the common voltage. A noise by-pass capacitor C₃ is also provided for removing any noise component superimposing the common voltage.

As can be seen from FIG. 21, the full-wave rectification circuit 33 in the shown circuit of FIG. 20 generates a negative polarity full-wave rectified signal. Utilizing the same arrangement for providing a common voltage in FIG. 20, the circuit of FIG. 17 can be modified as shown in FIG. 23 as the fourth implementation of the second embodiment of the signal processing system according to the invention.

Figure 23:
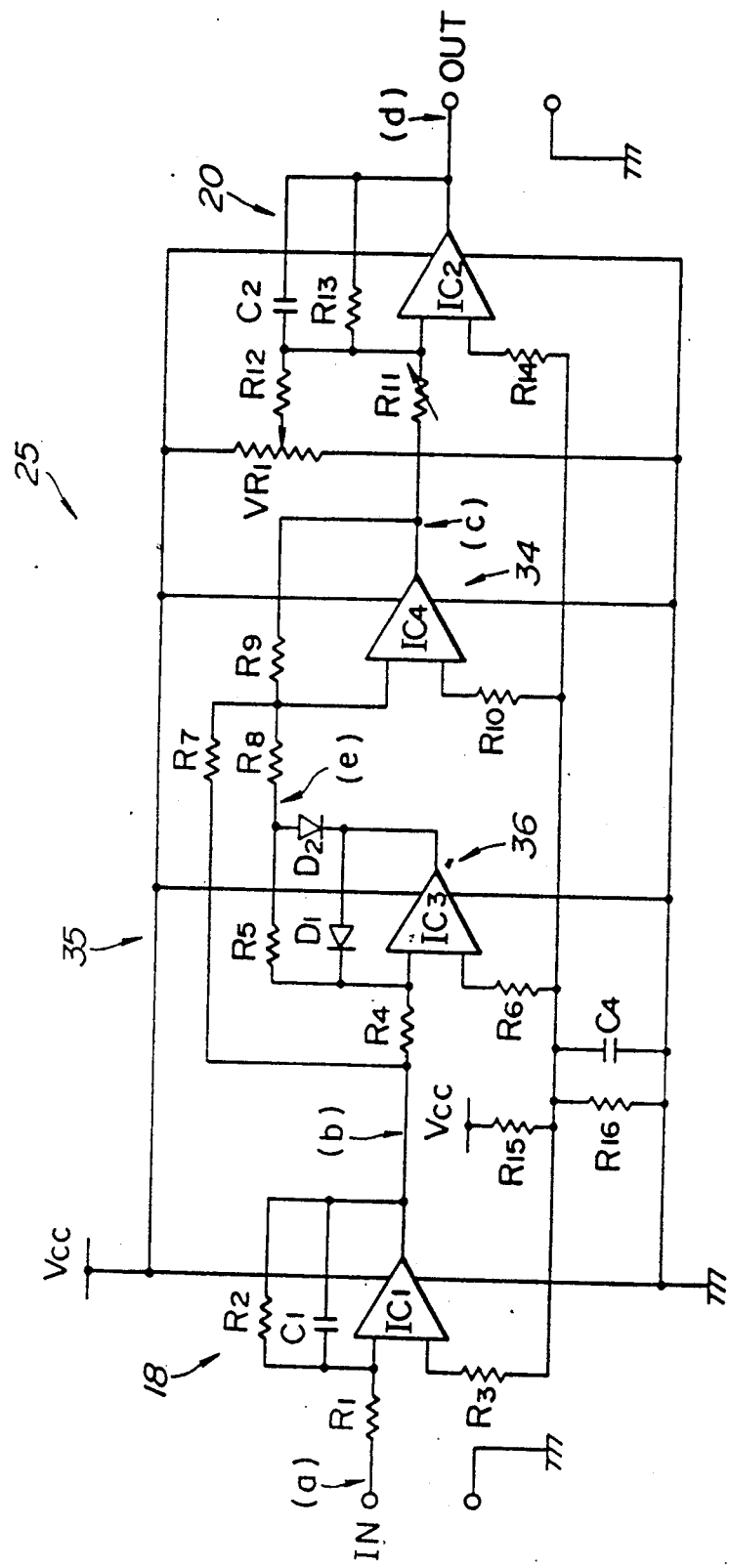
FIG. 23 is a circuit diagram of a third practical implementation of the second embodiment of the signal processing system according to the invention.
Figure 24:
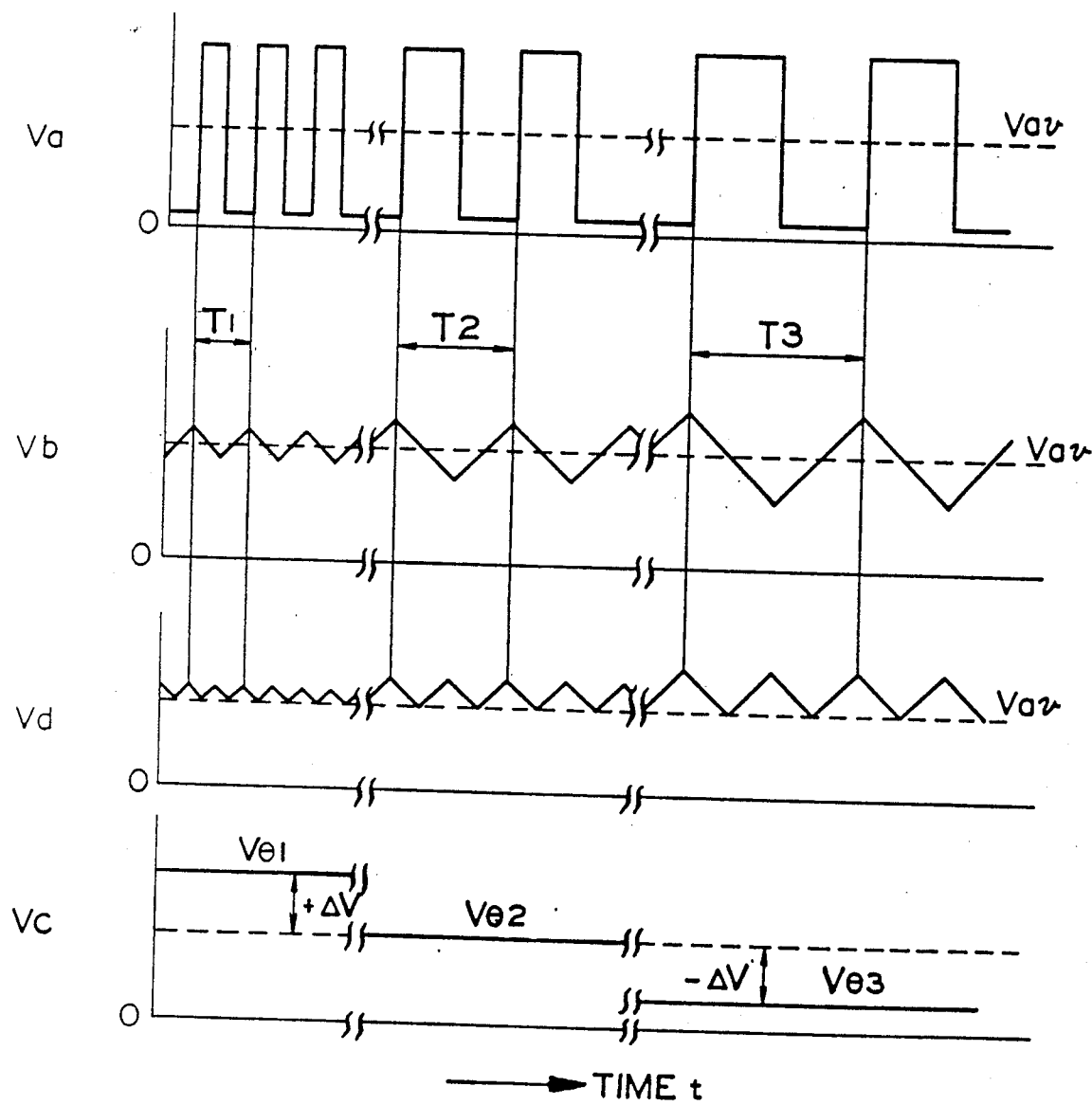
FIG. 24 is a timing chart showing the waveforms of signals in the circuit of FIG. 23.
Figure 25:
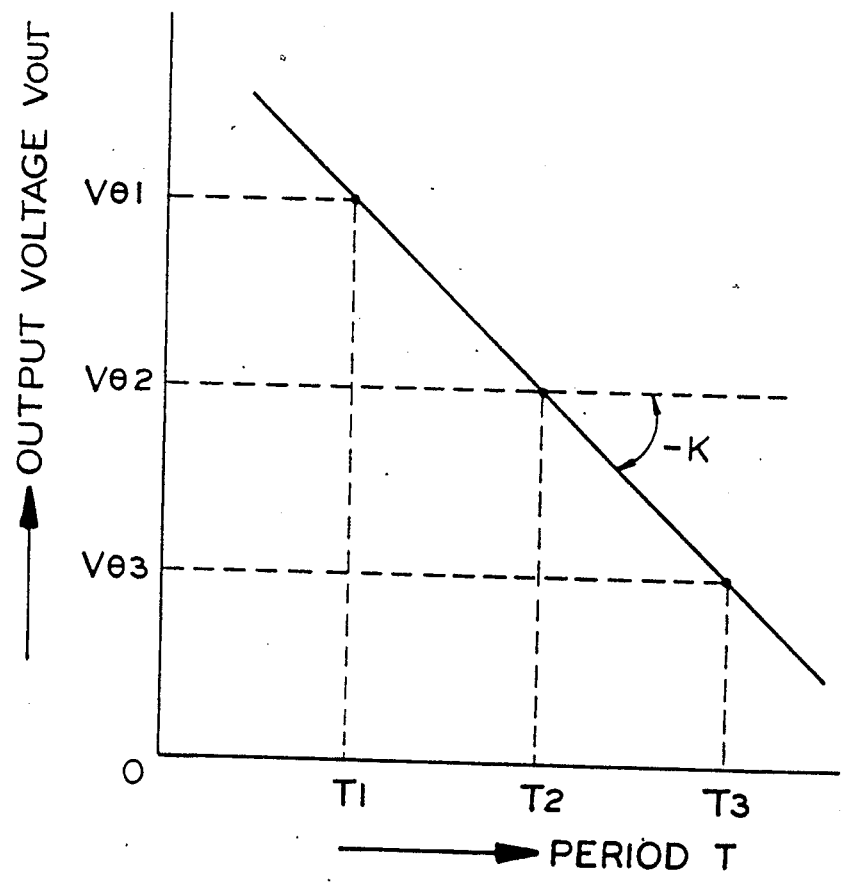
FIG. 25 is a chart showing the input and output of the circuit of FIG. 23.

FIG. 24 is a timing chart showing the wave forms of the signals in a circuit of FIG. 23 and FIG. 25 is a chart showing the input and output of the circuit of FIG. 23.

While the present invention has been disclosed in terms of the preferred embodiment in order to facilitate better understanding of the invention, it should be appreciated that the invention can be embodied in various ways without departing from the principle of the invention. Therefore, the invention should be understood to include all possible embodiments and modifications to the shown embodiments which can be embodied without departing from the principle of the invention set out in the appended claims.

What is claimed is:

1. A signal processing system for converting a constant amplitude and variable period periodic signal into a voltage signal comprising:
   a signal generator circuit receiving said periodic signal and converting said periodic signal into a converted signal having an amplitude which continuously varies according to the period of said periodic signal; and
   a direct current generator circuit composed of a peak detector circuit for receiving said converted signal to produce a direct current voltage signal having a voltage level variable in proportion to said amplitude of said converted signal, said direct current generator circuit including an amplifier circuit for receiving said direct current voltage signal for
   removing a ripple component superimposed on said direct current voltage signal of said peak detector circuit.

2. A signal processing system as set forth in claim 1, which performs period-to-voltage conversion for a rectangular pulse train.

3. A signal processing system as set forth in claim 1, wherein said converted signal generator circuit comprises an integrator circuit for integrating said periodic signal to generate a pulse signal.

4. A signal processing system as set forth in claim 1, wherein said peak detector circuit includes a switching transistor having predetermined voltage drop characteristics between a base electrode and an emitter electrode and means for compensating for said voltage drop.

5. A signal processing system as set forth in claim 4, wherein said compensating means comprises a normally conductive transistor arranged in complementary fashion with respect to said switching transistor.

6. A signal processing system as set forth in claim 1, wherein said direct current generator circuit comprises a full-wave rectification circuit for receiving said converted signal and producing a full-wave rectified signal, and said amplifier circuit amplifying said full-wave rectified signal to output said direct current voltage signal.

7. A signal processing system as set forth in claim 6, wherein said full-wave rectification circuit comprises a half-wave rectification circuit and a summing amplifier.

8. A signal processing system for converting a constant amplitude and variable period periodic signal into a voltage signal, comprising:
   a first converter means receiving said periodic signal and converting said periodic signal into a first converted signal having a continuous signal level increasing cycle and signal level decreasing cycle and defining upper and lower peak levels which appear in each cycle of said periodic signal, said upper and lower peak levels defining an amplitude of said first converted signal, which amplitude is variable corresponding to the period of said periodic signal; and a second converter means for receiving said first converted signal and producing a direct current voltage signal having a voltage level variable in proportion to said amplitude of said first converted signal, said second converter means including a peak detector circuit and an amplifier, said amplifier removing a ripple component superimposed on said direct current signal.

9. A signal processing system as set forth in claim 8, which performs period-to-voltage conversion for a rectangular pulse train.

10. A signal processing system as set forth in claim 9, wherein said first converter means comprises an integrator circuit for integrating said periodic signal to generate said first converted signal having said signal level increasing cycle and said signal level decreasing cycle.

11. A signal processing system as set forth in claim 10, wherein said peak detector circuit detects a peak level of said first converted signal and produces a direct current signal having a signal level corresponding to the peak level of said first converted signal.

12. A signal processing system as set forth in claim 11, wherein said amplifier receives said direct current signal from said peak detector circuit and amplifies said direct current with predetermined output characteristics for outputting said direct current voltage signal.

13. A signal processing system as set forth in claim 12, wherein said output characteristics is variable according to a predetermined schedule.

14. A signal processing system as set forth in claim 13, wherein said peak detector circuit includes a switching transistor having predetermined voltage drop characteristics between a base electrode and an emitter electrode and means for compensating for said voltage drop.

15. A signal processing system as set forth in claim 14, wherein said compensating means comprises a normally conductive transistor arranged in complementary fashion with respect to said switching transistor.

16. A signal processing system as set forth in claim 8, wherein said second converter means comprises a full-wave rectification circuit for receiving said first converted signal and for producing a full-wave rectified signal, and said amplifier amplifies said full-wave rectified signal to output said direct current voltage signal.

17. A signal processing system as set forth in claim 1, wherein said full-wave rectification circuit comprises a half-wave rectification circuit and a summing amplifier.

* * * * *